US011069796B2

(12) United States Patent
Koezuka et al.

(10) Patent No.: US 11,069,796 B2
(45) Date of Patent: Jul. 20, 2021

(54) MANUFACTURING METHOD OF SEMICONDUCTOR DEVICE

(71) Applicant: Semiconductor Energy Laboratory Co., Ltd., Atsugi (JP)

(72) Inventors: Junichi Koezuka, Tochigi (JP);
Kenichi Okazaki, Tochigi (JP);
Masataka Nakada, Tochigi (JP);
Yasuharu Hosaka, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/526,389

(22) Filed: Jul. 30, 2019

(65) Prior Publication Data
US 2020/0052100 A1    Feb. 13, 2020

(30) Foreign Application Priority Data
Aug. 9, 2018    (JP) .............................. JP2018-149954

(51) Int. Cl.
H01L 21/00      (2006.01)
H01L 29/66      (2006.01)
H01L 29/24      (2006.01)
H01L 29/786     (2006.01)
H01L 27/12      (2006.01)

(52) U.S. Cl.
CPC ........ *H01L 29/66969* (2013.01); *H01L 29/24* (2013.01); *H01L 29/7869* (2013.01); *H01L 27/1225* (2013.01); *H01L 29/78648* (2013.01)

(58) Field of Classification Search
CPC ........... H01L 29/66969; H01L 29/7869; H01L 29/24; H01L 27/1225; H01L 29/78648

USPC ........................................................ 438/104
See application file for complete search history.

(56) References Cited

U.S. PATENT DOCUMENTS

| 8,884,294 B2* | 11/2014 | Yamazaki ......... H01L 29/66742 |
| | | 257/59 |
| 9,496,408 B2 | 11/2016 | Yamazaki et al. |
| 9,653,614 B2* | 5/2017 | Yamazaki ........... H01L 29/4908 |
| 9,859,437 B2 | 1/2018 | Morosawa et al. |
| 2011/0147738 A1 | 6/2011 | Yamazaki et al. |

(Continued)

FOREIGN PATENT DOCUMENTS

| JP | 2011-228622 A | 11/2011 |
| JP | 2014-007399 A | 1/2014 |

*Primary Examiner* — Vu A Vu
(74) *Attorney, Agent, or Firm* — Robinson Intellectual Property Law Office; Eric J. Robinson

(57) ABSTRACT

A semiconductor layer containing a metal oxide is formed, a gate insulating layer containing an oxide is formed over the semiconductor layer, and a metal oxide layer is formed over the gate insulating layer. Heat treatment is performed after the metal oxide layer is formed, and the metal oxide layer is removed after the heat treatment is performed. After the metal oxide layer is removed, a gate electrode overlapping with part of the semiconductor layer is formed over the gate insulating layer. Then, a first element is supplied through the gate insulating layer to a region of the semiconductor layer that does not overlap with the gate electrode. Examples of the first element include phosphorus, boron, magnesium, aluminum, and silicon. The steps performed after the metal oxide layer is removed are each preferably performed at a temperature lower than or equal to the temperature of the heat treatment.

13 Claims, 24 Drawing Sheets

(56) References Cited

U.S. PATENT DOCUMENTS

| | | |
|---|---|---|
| 2011/0284844 A1 | 11/2011 | Endo et al. |
| 2012/0161126 A1 | 6/2012 | Yamazaki |
| 2013/0187152 A1 | 7/2013 | Yamazaki et al. |
| 2013/0200375 A1 | 8/2013 | Yamazaki |
| 2013/0221347 A1 | 8/2013 | Isobe et al. |
| 2015/0187823 A1 | 7/2015 | Miyairi et al. |
| 2015/0249157 A1 | 9/2015 | Yamazaki et al. |
| 2015/0249160 A1 | 9/2015 | Yamazaki et al. |
| 2015/0263141 A1 | 9/2015 | Yamazaki et al. |
| 2015/0270407 A1 | 9/2015 | Suzuki et al. |
| 2015/0303309 A1 | 10/2015 | Koezuka et al. |
| 2015/0348998 A1 | 12/2015 | Koezuka et al. |
| 2015/0372022 A1 | 12/2015 | Okazaki et al. |
| 2016/0079089 A1 | 3/2016 | Koezuka et al. |
| 2017/0025544 A1 | 1/2017 | Yamazaki et al. |
| 2017/0104089 A1 | 4/2017 | Koezuka et al. |
| 2017/0104090 A1 | 4/2017 | Koezuka et al. |
| 2017/0110337 A1 | 4/2017 | Akimoto et al. |
| 2018/0040722 A1 | 2/2018 | Obonai et al. |
| 2018/0182870 A1 | 6/2018 | Hosaka et al. |

\* cited by examiner

MANUFACTURING METHOD OF SEMICONDUCTOR DEVICE

BACKGROUND OF THE INVENTION

1. Field of the Invention

One embodiment of the present invention relates to a semiconductor device and a manufacturing method thereof. One embodiment of the present invention relates to a display device and a manufacturing method thereof.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof. A semiconductor device generally means a device that can function by utilizing semiconductor characteristics.

2. Description of the Related Art

As a semiconductor material that can be used in a transistor, an oxide semiconductor using a metal oxide has been attracting attention. For example, Patent Document 1 discloses a semiconductor device which achieves increased field-effect mobility (simply referred to as mobility or μFE in some cases) by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for a transistor using polycrystalline silicon or amorphous silicon can be retrofitted and utilized. A transistor using a metal oxide has higher field-effect mobility than a transistor using amorphous silicon; therefore, a high-performance display device provided with driver circuits can be obtained.

Patent Document 2 discloses a thin film transistor in which a source region and a drain region use an oxide semiconductor film including a low-resistance region containing at least one kind in a group consisting of aluminum, boron, gallium, indium, titanium, silicon, germanium, tin, and lead as a dopant.

PATENT DOCUMENT

[Patent Document 1] Japanese Published Patent Application No. 2014-007399
[Patent Document 2] Japanese Published Patent Application No. 2011-228622

SUMMARY OF THE INVENTION

One object of one embodiment of the present invention is to provide a semiconductor device which has favorable electrical characteristics. One object of one embodiment of the present invention is to provide a semiconductor device which has stable electrical characteristics. One object of one embodiment of the present invention is to provide a highly reliable semiconductor device.

Note that the descriptions of these objects do not disturb the existence of other objects. One embodiment of the present invention does not need to achieve all the objects. Other objects can be derived from the descriptions of the specification, the drawings, and the claims.

One embodiment of the present invention is a method for manufacturing a semiconductor device including the steps of forming a semiconductor layer containing a metal oxide; forming a gate insulating layer containing an oxide over the semiconductor layer; forming a metal oxide layer over the gate insulating layer; performing heat treatment after the metal oxide layer is formed; removing the metal oxide layer after the heat treatment is performed; forming a gate electrode overlapping with part of the semiconductor layer over the gate insulating layer after the metal oxide layer is removed; and supplying a first element through the gate insulating layer to a region of the semiconductor layer not overlapping with the gate electrode.

The first element is phosphorus, boron, magnesium, aluminum, or silicon, for example.

The metal oxide layer preferably includes an aluminum oxide film. Alternatively, the metal oxide layer and the semiconductor layer preferably include the same metal oxide.

The steps performed after the metal oxide layer is removed are each preferably performed at a temperature lower than or equal to the temperature of the heat treatment.

The gate insulating layer preferably includes a first layer over the semiconductor layer, a second layer over the first layer, and a third layer over the second layer. The film formation speed of the first layer is preferably lower than that of the second layer, and the film formation speed of the third layer is preferably lower than that of the second layer.

According to one embodiment of the present invention, a semiconductor device which has favorable electrical characteristics can be provided. According to one embodiment of the present invention, a semiconductor device which has stable electrical characteristics can be provided. According to one embodiment of the present invention, a highly reliable semiconductor device can be provided.

Note that the descriptions of the effects do not disturb the existence of other effects. One embodiment of the present invention does not need to have all the effects. Other effects can be derived from the descriptions of the specification, the drawings, and the claims.

DETAILED DESCRIPTION OF THE INVENTION

Figure 1A:
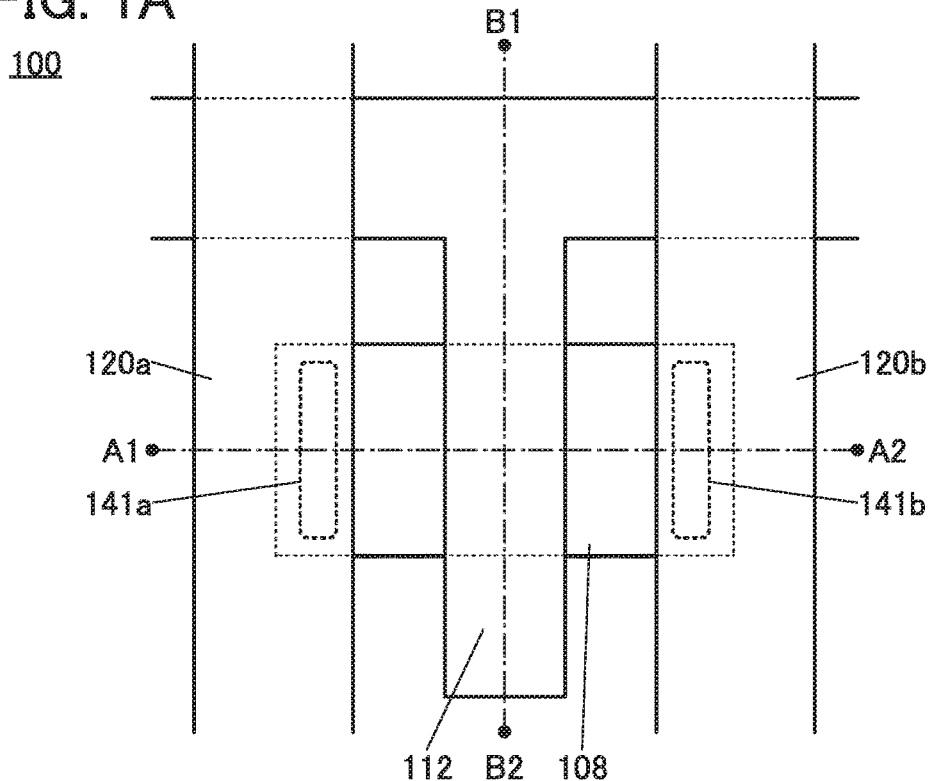
FIG. 1A is a top view illustrating an example of a transistor.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

In this specification and the like, the channel length direction of a transistor refers to one of directions parallel to the straight line that connects a source region and a drain region in the shortest distance. In other words, the channel length direction corresponds to one of directions of current flowing in a semiconductor layer when a transistor is in an on state. The channel width direction refers to a direction orthogonal to the channel length direction. Note that each of the channel length direction and the channel width direction is not fixed to one direction in some cases depending on the structure and the shape of a transistor.

Unless otherwise specified, off-state current in this specification and the like refers to a drain current of a transistor in an off state (also referred to as a non-conducting state or a cutoff state). Unless otherwise specified, an off state refers to, in an n-channel transistor, a state where the voltage $V_{gs}$ between its gate and source is lower than the threshold voltage $V_{th}$ (in a p-channel transistor, higher than $V_{th}$).

Embodiment 1

In this embodiment, a semiconductor device of one embodiment of the present invention and a manufacturing method thereof will be described with reference to FIGS. 1A to 1C, FIG. 2, FIGS. 3A to 3C, FIGS. 4A to 4C, FIGS. 5A to 5E, FIGS. 6A to 6C, FIGS. 7A to 7C, and FIGS. 8A and 8B. In this embodiment, a transistor will be specifically described as a semiconductor device.

The semiconductor device of one embodiment of the present invention is fabricated in such a manner that a semiconductor layer containing a metal oxide is formed; a gate insulating layer containing an oxide is formed over the semiconductor layer; a metal oxide layer is formed over the gate insulating layer; heat treatment is performed after the metal oxide layer is formed; the metal oxide layer is removed after the heat treatment is performed; a gate electrode overlapping with part of the semiconductor layer is formed over the gate insulating layer after the metal oxide layer is removed; and a first element is supplied (or added or injected) through the gate insulating layer to a region of the semiconductor layer not overlapping with the gate electrode.

In one embodiment of the present invention, heat treatment is performed after a semiconductor layer, a gate insulating layer, and a metal oxide layer are formed and before a gate electrode is formed. In the heat treatment, oxygen can be supplied from the gate insulating layer to the semiconductor layer.

The metal oxide layer is preferably formed in an oxygen-containing atmosphere. In that case, at the time of the formation of the metal oxide layer, oxygen can be supplied into the gate insulating layer and moreover, the semiconductor layer.

Preferably, the metal oxide layer does not easily transmit oxygen. In that case, oxygen contained in the gate insulating layer can be inhibited from being released to the metal oxide layer side, and supply of the oxygen to the semiconductor layer can be promoted. Thus, the oxygen vacancies (also referred to as Vo) in the semiconductor layer can be filled and the reliability of the transistor can be improved.

For example, an aluminum oxide film can be used for the metal oxide layer.

Alternatively, the metal oxide layer and the semiconductor layer preferably include the same metal oxide.

In the case where the metal oxide layer has conductivity, it is conceivable that the metal oxide layer is left by being processed into an island shape to be used as part of the gate electrode. However, processing might be difficult depending on the material and processing method for the metal oxide layer. For example, when a defect in the shape of the metal oxide layer is caused, coverage with a layer formed over the metal oxide layer decreases.

Also when the metal oxide layer has an insulating property, the metal oxide layer left and used as part of the gate insulating layer causes a reduction in the reliability of the transistor in some cases. For example, a defect state might be formed at the interface between the gate insulating layer formed earlier and the metal oxide layer or in the vicinity of the interface depending on the film quality of the metal oxide layer or the like.

Here, an indicator in evaluating the reliability of a transistor is a gate bias temperature stress test. GBT stress tests are a kind of accelerated test and can measure a change in transistor characteristics due to long-term use, in a short time. Among the GBT stress tests, a test in which a state where a positive potential relative to a source potential and a drain potential is supplied to a gate is maintained at high temperatures is referred to as a positive bias temperature stress (PBTS) test, and a test in which a state where a negative potential is supplied to a gate is maintained at high temperatures is referred to as a negative bias temperature stress (NBTS) test. The PBTS test and the NBTS test conducted in a state where irradiation with light such as white LED light is performed are respectively referred to as a positive bias temperature illumination stress (PBTIS) test and a negative bias temperature illumination stress (NBTIS) test.

In an n-channel transistor in which a metal oxide is used for a semiconductor layer, a positive potential is applied to a gate in putting the transistor in an on state (a state where a current flows); thus, the amount of change in threshold voltage in the PBTS test is one important item to be focused on as an indicator of the reliability of the transistor.

The amount of change in the threshold voltage in a PBTS test of a transistor is sometimes larger in the case where a metal oxide layer is provided between a gate electrode and a gate insulating layer than in the case where the metal oxide layer is not provided therebetween (see Example 1).

Thus, in one embodiment of the present invention, a metal oxide layer is entirely removed after heat treatment is performed. Removal of the metal oxide layer can improve the reliability of the transistor.

The metal oxide layer is preferably removed by wet etching. When wet etching is employed, the gate insulating layer can be inhibited from being etched at the same time as the metal oxide layer. Accordingly, a reduction in the thickness of the gate insulating layer can be inhibited and the thickness of the gate insulating layer can be uniform.

After that, the gate electrode is formed and the first element is supplied to the semiconductor layer using the gate electrode as a mask, whereby a pair of low-resistance regions can be formed in the semiconductor layer. That is, the semiconductor layer is formed to include a channel formation region overlapping with the gate electrode and the pair of low-resistance regions between which the channel formation region is sandwiched.

The first element is phosphorus, boron, magnesium, aluminum, or silicon, for example.

Note that the above-described heat treatment is preferably performed at relatively high temperatures (e.g., 350° C.) to supply oxygen sufficiently to the semiconductor layer from the gate insulating layer. Meanwhile, oxygen might be more easily extracted from the semiconductor layer and the gate insulating layer after the metal oxide layer is removed than at the time when there is the metal oxide layer. For example, oxygen contained in the channel formation region of the semiconductor layer and the gate insulating layer might diffuse to the low-resistance region and the gate electrode. Therefore, a step that is performed after removal of the metal oxide layer is preferably performed at a temperature lower than or equal to the temperature of the heat treatment described above. Thus, formation of oxygen vacancies in the semiconductor layer can be suppressed. When the channel formation region of the semiconductor layer has few oxygen vacancies and a low carrier density, a significantly low off-state current of the transistor and improved reliability of the transistor can be achieved.

In general, heat treatment needs to be performed after supply of an impurity in order to reduce the resistance of silicon. Meanwhile, since the resistance of the semiconductor layer containing a metal oxide is reduced only by supply of the first element, it is not necessary to perform heat treatment for reducing the resistance. Thus, even in the case where a step of forming the pair of low-resistance regions in the semiconductor layer is performed after removal of the metal oxide layer, it is possible to form a semiconductor layer including both a channel formation region with sufficiently reduced oxygen vacancies and an extremely low carrier density and a source region and a drain region that have extremely low electric resistance; thus, it is possible to provide a semiconductor device with excellent electrical characteristics and high reliability.

In one embodiment of the present invention, the first element can also be supplied to the gate insulating layer. Specifically, when the gate electrode is used as a mask, the first element is mainly supplied to a portion of the gate insulating layer which overlaps with the low-resistance region of the semiconductor layer, and the first element is less likely to be supplied to a portion of the gate insulating layer which overlaps with the channel formation region of the semiconductor layer. Thus, in the case where heat treatment is performed after supply of the first element, oxygen is supplied from the gate insulating layer to the channel formation region and oxygen vacancies in the channel formation region are filled. Meanwhile, the low-resistance regions are less likely to be supplied with oxygen from the gate insulating layer and thus less likely to have its electric resistance increased. Also for this reason, it is possible to form a semiconductor layer including both a channel formation region with sufficiently reduced oxygen vacancies and an extremely low carrier density and a source region and a drain region that have extremely low electric resistance; thus, it is possible to provide a semiconductor device with excellent electrical characteristics and high reliability.

Structure Example 1

Figure 1B:
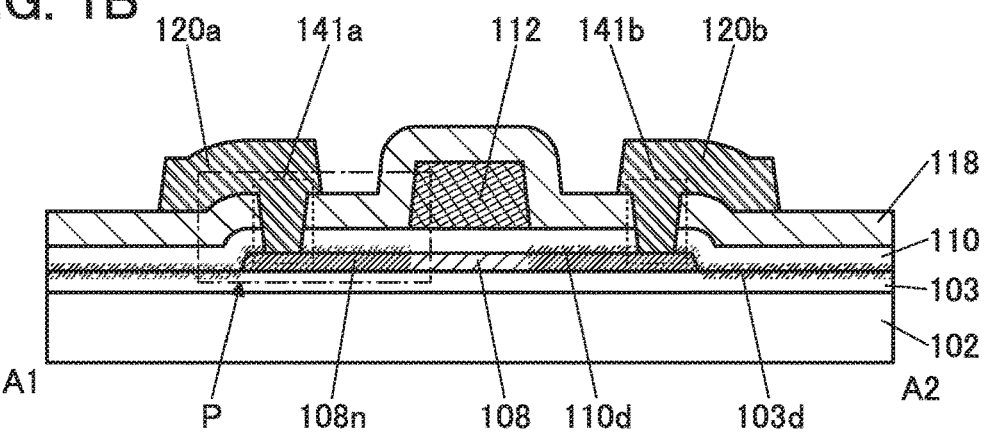
FIGS. 1B and 1C are cross-sectional views illustrating the example of the transistor.
Figure 1C:
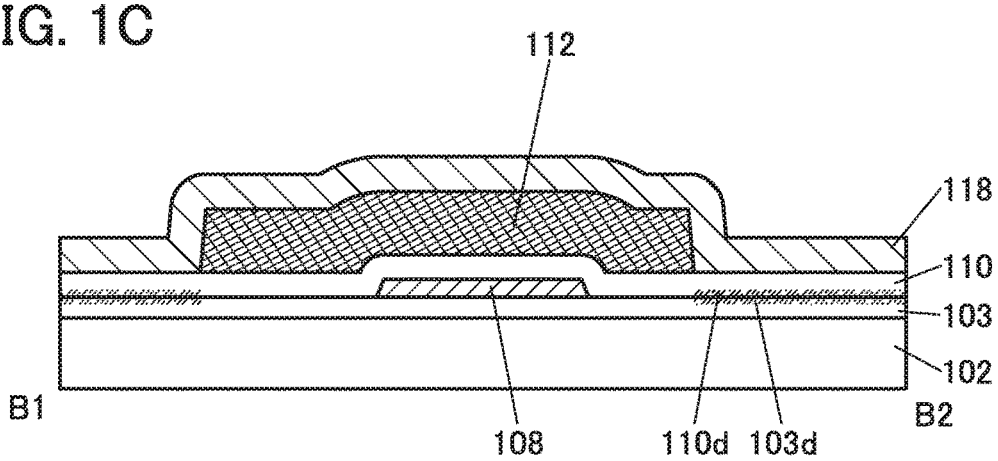

FIG. 1A is a top view of a transistor 100. FIG. 1B is a cross-sectional view taken along a dashed-dotted line A1-A2 in FIG. 1A. FIG. 1C is a cross-sectional view taken along a dashed-dotted line B1-B2 in FIG. 1A. The direction of the dashed-dotted line A1-A2 corresponds to a channel length direction, and the direction of the dashed-dotted line B1-B2 corresponds to a channel width direction. Note that in FIG. 1A, some components of the transistor 100 (e.g., a gate insulating layer) are not illustrated. Some components are not illustrated in top views of transistors in the following drawings, as in FIG. 1A.

The transistor 100 includes an insulating layer 103, an island-like semiconductor layer 108, a gate insulating layer 110, a gate electrode 112, and an insulating layer 118.

The insulating layer 103 is provided over a substrate 102. The semiconductor layer 108 is provided over the insulating layer 103. The gate insulating layer 110 is in contact with a top surface of the insulating layer 103 and a top surface and a side surface of the semiconductor layer 108. The gate electrode 112 is provided over the gate insulating layer 110. The gate electrode 112 includes a portion that overlaps with the semiconductor layer 108 with the gate insulating layer 110 therebetween. The insulating layer 118 is provided to cover a top surface of the gate insulating layer 110 and a top surface and a side surface of the gate electrode 112.

The transistor 100 is a top-gate transistor, in which the gate electrode 112 is provided over the semiconductor layer 108.

As illustrated in FIGS. 1A and 1B, the transistor 100 may include a conductive layer 120a and a conductive layer 120b over the insulating layer 118. One of the conductive layer 120a and the conductive layer 120b serves as a source electrode, and the other serves as a drain electrode. The conductive layer 120a and the conductive layer 120b are electrically connected to later-described low-resistance regions 108n through an opening portion 141a and an opening portion 141b, respectively, which are provided in the insulating layer 118 and the gate insulating layer 110.

The semiconductor layer 108 preferably includes a metal oxide exhibiting semiconductor characteristics (hereinafter also referred to as an oxide semiconductor).

The semiconductor layer 108 includes a region overlapping with the gate electrode 112 and the pair of low-resistance regions 108n between which the region is sandwiched. The region of the semiconductor layer 108 that overlaps with the gate electrode 112 serves as a channel formation region where a channel of the transistor 100 can be formed. The pair of low-resistance regions 108n function as a source region and a drain region of the transistor 100.

The low-resistance region 108n can be regarded as a region having lower resistance than the channel formation region, a region having a higher carrier density than the channel formation region, a region having a higher oxygen vacancy density than the channel formation region, a region having a higher impurity concentration than the channel formation region, or an n-type region.

The low-resistance region 108n is a region containing one kind of or two or more kinds of impurity elements. Examples of the impurity element include hydrogen, boron, carbon, nitrogen, fluorine, phosphorus, sulfur, arsenic, aluminum, magnesium, silicon, and a rare gas (e.g., helium, neon, argon, krypton, or xenon). The pair of low-resistance regions 108n preferably contain boron, phosphorus, aluminum, magnesium, or silicon and further preferably contain boron or phosphorus.

Note that the above impurity element contained in the low-resistance region 108n sometimes partly diffuses to the channel formation region owing to the influence of heat applied during the manufacturing process or the like. The concentration of the impurity element in the channel formation region is preferably lower than or equal to one tenth, further preferably lower than or equal to one hundredth of that of the impurity element in the low-resistance region 108n.

The gate insulating layer 110 includes a region that is in contact with the channel formation region of the semiconductor layer 108 and that overlaps with the gate electrode 112. The gate insulating layer 110 includes a region that is in contact with the pair of low-resistance regions 108n in the semiconductor layer 108 and that does not overlap with the gate electrode 112.

In the case where the semiconductor layer 108 includes a metal oxide, it is preferable that the gate insulating layer 110 include an oxide. It is particularly preferable that the gate insulating layer 110 be an oxide film from which oxygen can be released by heating.

When heat treatment is performed in a state where the gate insulating layer 110 containing an oxide is provided in contact with the top surface of the semiconductor layer 108, oxygen released from the gate insulating layer 110 can be supplied to the semiconductor layer 108. Thus, oxygen vacancies in the semiconductor layer 108 can be filled, whereby a highly reliable transistor can be obtained.

In one embodiment of the present invention, before formation of the gate electrode 112 and supply of an impurity element to the semiconductor layer 108, heat treatment is performed and oxygen is supplied from the gate insulating layer 110 to the semiconductor layer 108. In contrast, depending on the structure of the transistor or the semiconductor device or display device including the transistor, heat treatment is further performed after formation of the gate electrode 112 and supply of an impurity element to the semiconductor layer 108 in some cases. In this case, oxygen contained in the channel formation region of the semiconductor layer 108 might diffuse to the low-resistance region 108n and the gate electrode 112. In addition, oxygen might be supplied from the gate insulating layer 110 to the low-resistance region 108n. When oxygen is supplied to the low-resistance region 108n, the carrier density decreases and the electric resistance increases in some cases.

In view of this, it is preferable that the above impurity element be contained in the region of the gate insulating layer 110 that is in contact with the pair of low-resistance regions 108n, i.e., the region of the gate insulating layer 110 that does not overlap with the gate electrode 112. It is preferable that the region of the gate insulating layer 110 that does not overlap with the gate electrode 112 include a region where the impurity concentration is higher than that in the region of the gate insulating layer 110 that overlaps with the gate electrode 112 and lower than that in the low-resistance region 108n. When the above impurity element is supplied to the oxide film from which oxygen can be released by heating, the amount of released oxygen can be reduced. Therefore, when the above impurity element is contained in the region of the gate insulating layer 110 that is in contact with the low-resistance region 108n, oxygen is less likely to be supplied from the gate insulating layer 110 to the low-resistance region 108n, whereby the low-resistance region 108n can remain in a low-electric-resistance state.

Employing such a structure makes it possible to provide a semiconductor device including both a channel formation region with sufficiently reduced oxygen vacancies and an extremely low carrier density and a source region and a drain region that have extremely low electric resistance and having excellent electrical characteristics and high reliability.

The insulating layer 103 and the gate insulating layer 110 that are in contact with the channel formation region of the semiconductor layer 108 preferably contain an oxide. For the insulating layer 103 and the gate insulating layer 110, an oxide film such as a silicon oxide film, a silicon oxynitride film, or an aluminum oxide film can be used. Accordingly, heat treatment during the manufacturing process of the transistor 100 can supply oxygen desorbed from the insulating layer 103 and the gate insulating layer 110 to the channel formation region of the semiconductor layer 108 to reduce oxygen vacancies in the semiconductor layer 108.

Figure 2:
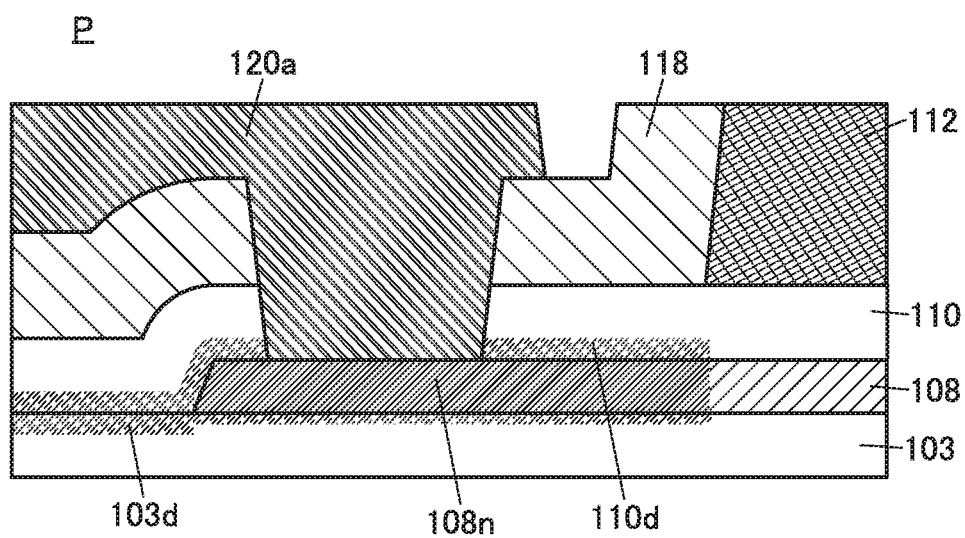
FIG. 2 is a cross-sectional view illustrating an example of a transistor.

FIG. 2 is an enlarged cross-sectional view of a region P surrounded by a dashed-dotted line in FIG. 1B.

The gate insulating layer 110 includes a region 110d that contains the above impurity element. The region 110d is positioned at least at the interface between the gate insulating layer 110 and the low-resistance region 108n or in the vicinity of the interface. The region 110d is also positioned at least at the interface between the gate insulating layer 110 and the insulating layer 103 or in the vicinity of the interface in a region where the semiconductor layer 108 and the gate electrode 112 are not provided. It is preferable that the region 110d not be provided in a portion that is in contact with the channel formation region of the semiconductor layer 108, as shown in FIG. 1B, FIG. 1C, and FIG. 2.

The insulating layer 103 includes, at the interface in contact with the gate insulating layer 110 or in the vicinity of the interface, a region 103d containing the above impurity element. As illustrated in FIG. 2, the region 103d may be provided at the interface where the insulating layer 103 and the low-resistance region 108n are in contact with each other or in the vicinity of the interface. In that case, in the region 103d, the portion overlapping with the low-resistance region 108n has a lower impurity concentration than the portion in contact with the gate insulating layer 110.

Here, the impurity concentration of the low-resistance region 108n preferably has a concentration gradient such that the concentration is higher in a portion closer to the gate insulating layer 110. In that case, an upper portion of the low-resistance region 108n has a lower resistance and thus, the contact resistance with the conductive layer 120a (or the conductive layer 120b) can be more effectively reduced. The total amount of the impurity element in the low-resistance region 108n can be smaller than that in the case where the concentration is uniform throughout the entire low-resistance region 108n; thus, the amount of the impurity that might diffuse to the channel formation region owing to the influence of the heat during the manufacturing process can be kept small.

The impurity concentration in the region 110d preferably has a concentration gradient such that the concentration is higher in a portion closer to the low-resistance region 108n. In the gate insulating layer 110 using an oxide film from which oxygen can be released by heating, release of oxygen in the region 110d containing the above impurity element can be reduced as compared to that in the other regions. Thus, the region 110d that is positioned at the interface with the low-resistance region 108n in the gate insulating layer 110 or in the vicinity of the interface can function as a blocking layer against oxygen and effectively reduce the oxygen supplied to the low-resistance region 108n.

Supply of the impurity element is performed on at least the semiconductor layer 108 with the use of the gate electrode 112 as a mask. Furthermore, it is preferable that the impurity element be also supplied to the gate insulating layer 110. In that case, the region 110d can be formed in a self-aligned manner at the same time as formation of the low-resistance region 108n.

Note that in FIG. 2 and the like, to show that a high-impurity-concentration portion of the gate insulating layer 110 is positioned at the interface with the semiconductor layer 108 or in the vicinity of the interface in an exaggerated way, the region 110d is illustrated with a hatch pattern only in the vicinity of the semiconductor layer 108 in the gate insulating layer 110; however, the impurity element is actually contained in the entire gate insulating layer 110 in the thickness direction.

The impurity element is preferably supplied by a plasma ion doping method or an ion implantation method. These methods can easily adjust the depth at which ions are added and thus make it easy to add ions aiming at a region including the gate insulating layer 110 and the semiconductor layer 108.

The conditions of supply of the impurity element are preferably set such that the impurity concentration is the highest in a region of the semiconductor layer 108 on the gate insulating layer 110 side or such that the impurity concentration is the highest at the interface between the semiconductor layer 108 and the gate insulating layer 110 or in the vicinity of the interface. In that case, the impurity element at an appropriate concentration can be supplied to both the semiconductor layer 108 and the gate insulating layer 110 by one step. Furthermore, when the upper portion of the low-resistance region 108n is supplied with the impurity element at a high concentration to have lowered resistance, the contact resistance between the low-resistance region 108n and the source electrode or the drain electrode can be lowered. In addition, by formation of the region having a high concentration of the impurity element in a portion of the gate insulating layer 110 near the low-resistance region 108n, diffusibility of oxygen in this portion is reduced and oxygen in the gate insulating layer 110 can be further inhibited from diffusing to the low-resistance region 108n side.

The low-resistance region 108n and the region 110d each preferably include a region having an impurity concentration of higher than or equal to $1\times10^{19}$ atoms/cm$^3$ and lower than or equal to $1\times10^{23}$ atoms/cm$^3$, further preferably higher than or equal to $5\times10^{19}$ atoms/cm$^3$ and lower than or equal to $5\times10^{22}$ atoms/cm$^3$, still further preferably higher than or equal to $1\times10^{20}$ atoms/cm$^3$ and lower than or equal to $1\times10^{22}$ atoms/cm$^3$. The low-resistance region 108n preferably includes a portion having a higher impurity concentration than the region 110d of the gate insulating layer 110, in which case the electric resistance of the low-resistance region 108n can be further reduced.

The concentrations of the impurities contained in the low-resistance region 108n and the region 110d can be analyzed by an analysis method such as secondary ion mass spectrometry (SIMS) or X-ray photoelectron spectroscopy (XPS). In the case of using XPS analysis, it is possible to find out the concentration distribution in the depth direction by combination of XPS analysis and ion sputtering from a front surface side or a rear surface side.

In the case where an element that is easily bonded to oxygen is used as the impurity element, the impurity element exists in a state of being bonded to oxygen in the semiconductor layer 108. In other words, the impurity element takes oxygen in the semiconductor layer 108 away to cause oxygen vacancies in the semiconductor layer 108, the oxygen vacancies are bonded to hydrogen in the film, and thus, carriers are generated. Furthermore, since the impurity element in the semiconductor layer 108 exists stably in an oxidized state, the impurity element is not easily desorbed by heat applied during the process, which makes it possible to obtain the low-resistance region 108n that is stable in a low-electric-resistance state.

In the case where an element that is easily bonded to oxygen is used as the impurity element, the impurity element exists in a state of being bonded to oxygen in the gate insulating layer 110 as in the semiconductor layer 108. When oxygen and the impurity element are bonded and stabilized, the region containing the impurity element is brought into a state where even heating hardly desorbs oxygen and oxygen does not easily diffuse to other layers. Thus, oxygen can be supplied to the channel formation region while supply of oxygen from the gate insulating layer 110 to the low-resistance region 108n is inhibited. Accordingly, oxygen vacancies in the channel formation region can be reduced while the resistance of the low-resistance region 108n is prevented from increasing. As a result, a transistor which has favorable electrical characteristics and high reliability can be obtained.

As the impurity element, an element that is stabilized by being bonded to oxygen in the semiconductor layer 108 and in the gate insulating layer 110 is preferably used. For example, an element an oxide of which can exist as a solid in a normal state is preferably used. Examples of particularly preferred elements include typical non-metal elements except a rare gas and hydrogen, typical metal elements, and transition metal elements, and specifically, boron, phosphorus, aluminum, magnesium, and silicon are preferable.

For example, in the case where boron is used as the impurity element, boron contained in the low-resistance region 108n and the region 110d can exist in a state of being bonded to oxygen. This can be confirmed when a spectrum peak attributed to a $B_2O_3$ bond is observed in XPS analysis. Furthermore, in XPS analysis, the intensity of a spectrum peak attributed to a state where a boron element exists alone is so low that the spectrum peak is not observed or is buried in background noise at the measurement limit.

The insulating layer 118 functions as a protective layer protecting the transistor 100. The insulating layer 118 preferably has a function of preventing diffusion of oxygen that might be released from the gate insulating layer 110, to the outside. For example, an inorganic insulating material such as an oxide or a nitride can be used. More specifically, for example, an inorganic insulating material such as silicon nitride, silicon nitride oxide, silicon oxynitride, aluminum oxide, aluminum oxynitride, aluminum nitride, hafnium oxide, or hafnium aluminate can be used.

Structure Example 2

Figure 3A:
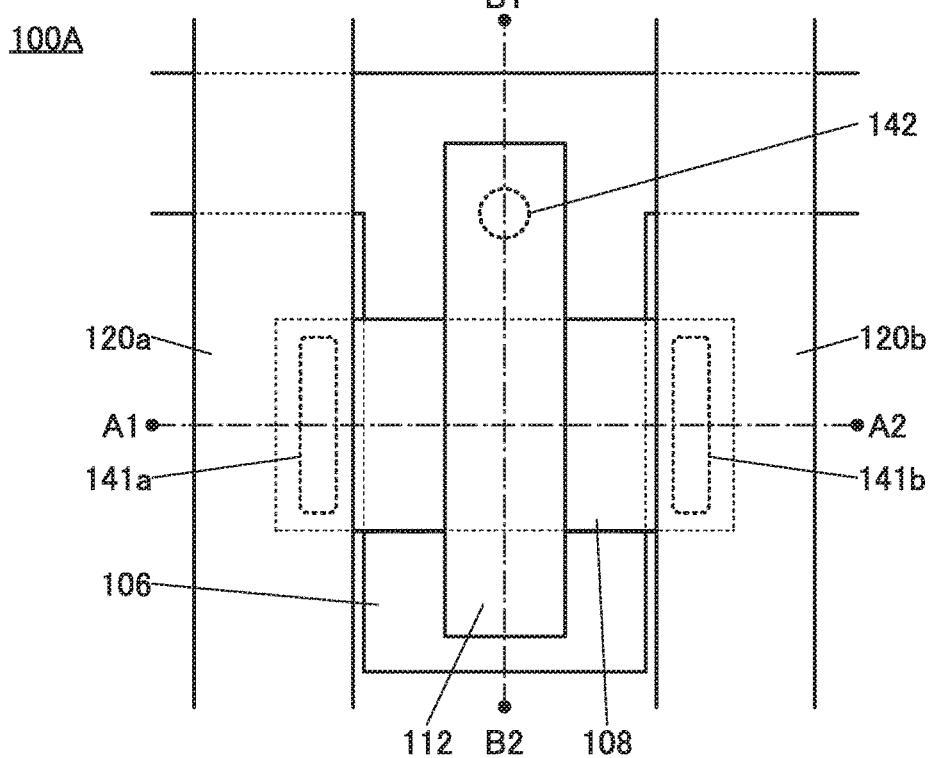
FIG. 3A is a top view illustrating an example of a transistor.
Figure 3B:
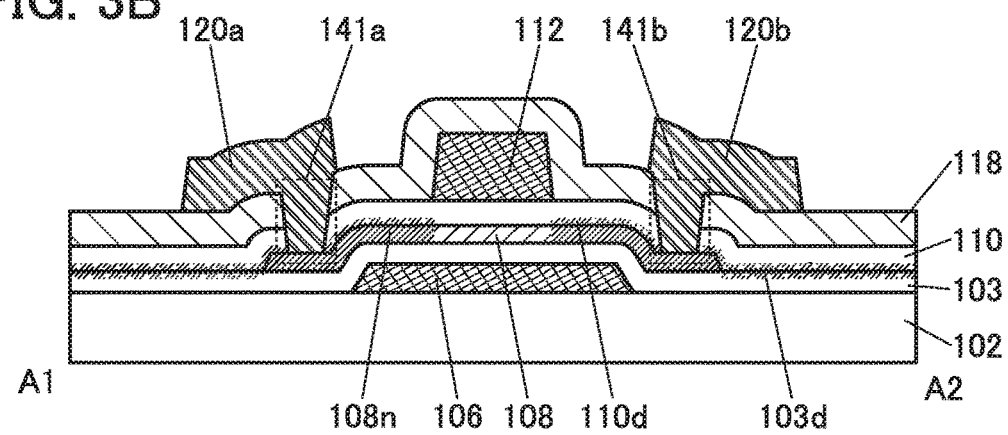
FIGS. 3B and 3C are cross-sectional views illustrating the example of the transistor.
Figure 3C:
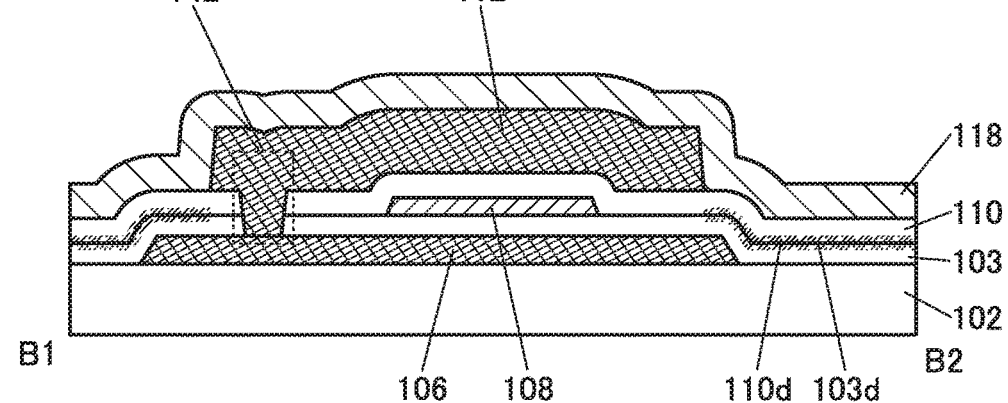

FIG. 3A is a top view of a transistor 100A. FIG. 3B is a cross-sectional view taken along a dashed-dotted line A1-A2 in FIG. 3A. FIG. 3C is a cross-sectional view taken along a dashed-dotted line B1-B2 in FIG. 3A. The direction of the dashed-dotted line A1-A2 corresponds to a channel length direction, and the direction of the dashed-dotted line B1-B2 corresponds to a channel width direction.

The transistor 100A is different from the transistor 100 in that the transistor 100A includes a conductive layer 106 between the substrate 102 and the insulating layer 103. The conductive layer 106 includes a region overlapping with the semiconductor layer 108 and the gate electrode 112.

In the transistor 100A, the conductive layer 106 has a function of a first gate electrode (also referred to as a bottom gate electrode), and the gate electrode 112 has a function of a second gate electrode (also referred to as a top gate electrode). Part of the insulating layer 103 functions as a first gate insulating layer, and part of the gate insulating layer 110 functions as a second gate insulating layer.

A portion of the semiconductor layer 108 that overlaps with at least one of the gate electrode 112 and the conductive layer 106 functions as a channel formation region. Note that for easy explanation, a portion of the semiconductor layer 108 that overlaps with the gate electrode 112 will be sometimes referred to as a channel formation region in the following description; however, a channel can be actually formed in a portion not overlapping with the gate electrode 112 and overlapping with the conductive layer 106 (a portion including the low-resistance region 108n).

As illustrated in FIG. 3C, the conductive layer 106 may be electrically connected to the gate electrode 112 through an opening portion 142 provided in the gate insulating layer 110 and the insulating layer 103. In that case, the conductive layer 106 and the gate electrode 112 can be supplied with the same potential.

The conductive layer 106 can be formed using a material similar to that for the gate electrode 112, the conductive layer 120a, or the conductive layer 120b. Specifically, a material containing copper is preferably used for the conductive layer 106, in which case wiring resistance can be reduced.

As illustrated in FIG. 3A and FIG. 3C, the gate electrode 112 and the conductive layer 106 preferably extend beyond an end portion of the semiconductor layer 108 in the channel width direction. In that case, as shown in FIG. 3C, the semiconductor layer 108 is entirely covered with the gate electrode 112 and the conductive layer 106 in the channel width direction with the gate insulating layer 110 between the semiconductor layer 108 and the gate electrode 112 and with the insulating layer 103 between the semiconductor layer 108 and the conductive layer 106.

With such a structure, the semiconductor layer 108 can be electrically surrounded by electric fields generated by a pair of gate electrodes. At this time, it is particularly preferable that the conductive layer 106 and the gate electrode 112 be supplied with the same potential. In that case, electric fields for inducing a channel can be effectively applied to the semiconductor layer 108, whereby the on-state current of the transistor 100A can be increased. Thus, the transistor 100A can also be miniaturized.

Note that the gate electrode 112 and the conductive layer 106 are not necessarily connected to each other. In that case, a constant potential may be supplied to one of the pair of gate electrodes, and a signal for driving the transistor 100A may be supplied to the other. In this case, the potential supplied to one of the electrodes can control the threshold voltage at the time of driving the transistor 100A with the other electrode.

[Application Example]

Next, a semiconductor device of one embodiment of the present invention including a transistor and a capacitor will be described as an application example with reference to FIGS. 4A to 4C. Specifically, examples will be described in which a semiconductor layer 108c including an impurity is used as one electrode of the capacitor and the transistor and the capacitor are formed on the same plane.

Figure 4A:
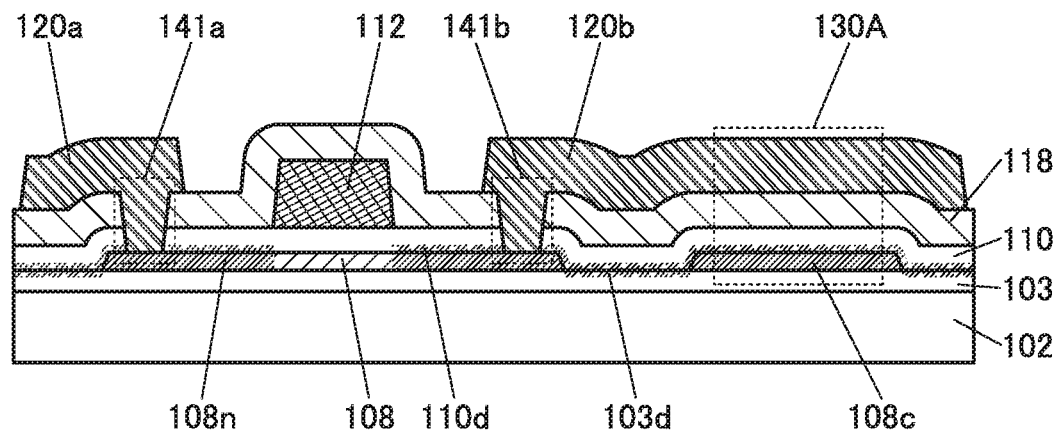
FIGS. 4A to 4C are cross-sectional views illustrating examples of transistors.

A capacitor 130A illustrated in FIG. 4A is provided adjacent to the transistor 100 (FIGS. 1A to 1C).

Figure 4B:
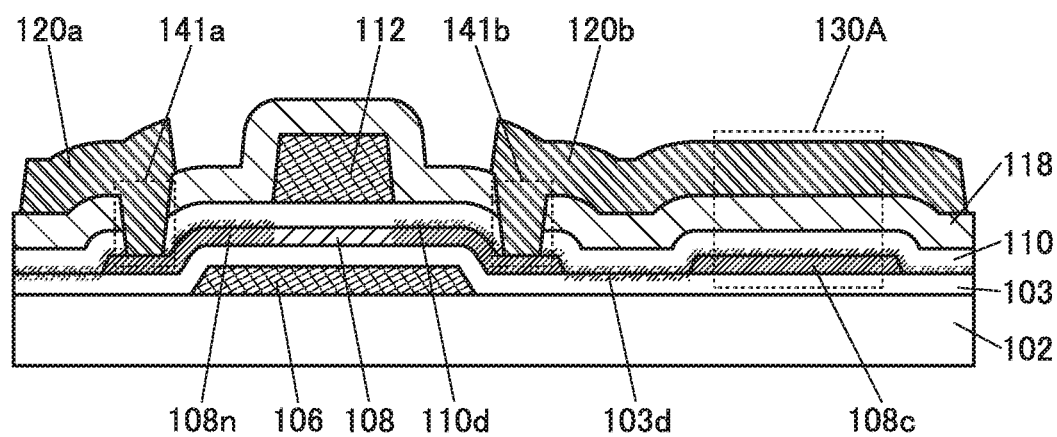

The capacitor 130A illustrated in FIG. 4B is provided adjacent to the transistor 100A (FIGS. 3A to 3C).

The capacitor 130A has a structure in which the gate insulating layer 110 and the insulating layer 118 that serve as a dielectric are provided between the semiconductor layer 108c and the conductive layer 120b.

The semiconductor layer 108c is provided on the same plane as the semiconductor layer 108. For example, the semiconductor layer 108c can be formed in such a manner that the metal oxide film which is the same as that for the semiconductor layer 108 is processed and the impurity element which is the same as that for the low-resistance region 108n is then supplied.

With such a structure, the capacitor 130A can be manufactured at the same time as the transistor without an increase in the number of manufacturing steps.

Figure 4C:
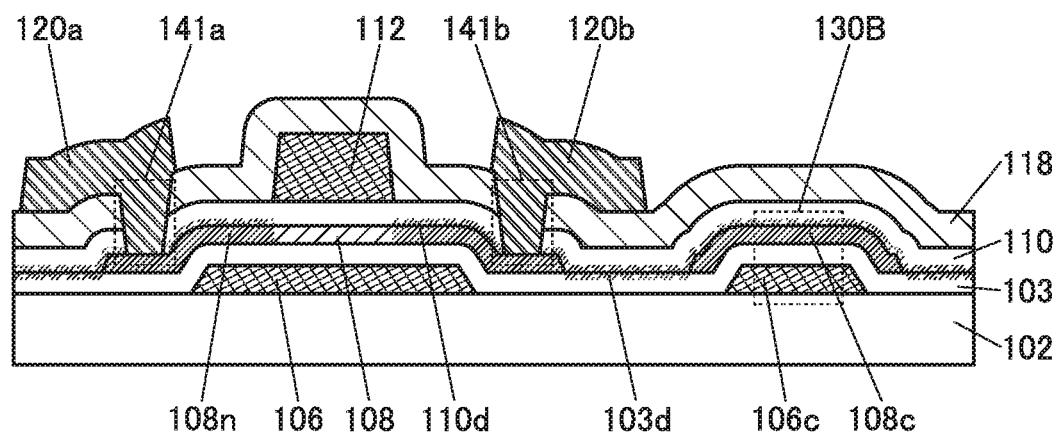

A capacitor 130B illustrated in FIG. 4C is provided adjacent to the transistor 100A (FIGS. 3A to 3C).

The capacitor 130B has a structure in which the insulating layer 103 serving as a dielectric is provided between a conductive layer 106c and the semiconductor layer 108c.

The conductive layer 106c is provided on the same plane as the conductive layer 106. The conductive layer 106c can be formed by processing the conductive film which is the same as that for the conductive layer 106.

The capacitor 130B can have a thinner dielectric than the capacitor 130A and thus can have higher capacitance.

[Components of Semiconductor Device]

Next, components of the semiconductor device in this embodiment will be described in detail. Note that the description of the components already explained is omitted in some cases.

Although there is no particular limitation on a material and the like of the substrate 102, it is necessary that the substrate have heat resistance high enough to withstand at least heat treatment performed later. For example, a single crystal semiconductor substrate or a polycrystalline semiconductor substrate including silicon or silicon carbide as a material, a compound semiconductor substrate of silicon germanium or the like, an SOI substrate, a glass substrate, a ceramic substrate, a quartz substrate, a sapphire substrate, or the like may be used as the substrate 102. Alternatively, any of these substrates over which a semiconductor element is provided may be used as the substrate 102.

A flexible substrate may be used as the substrate 102, and the transistor 100 or the like may be formed directly on the flexible substrate. Alternatively, a separation layer may be provided between the substrate 102 and the transistor 100 and the like. The separation layer can be used when part or the whole of a semiconductor device completed thereover is separated from the substrate 102 and transferred onto another substrate. In such a case, the transistor 100 or the like can be transferred onto a substrate having low heat resistance or a flexible substrate as well.

For example, a single layer or stacked layers using an oxide insulating film or a nitride insulating film can be formed as the insulating layer 103. To improve the properties of the interface with the semiconductor layer 108, at least a region in the insulating layer 103, which is in contact with the semiconductor layer 108, is preferably formed using an oxide insulating film. The insulating layer 103 is preferably formed using a film from which oxygen is released by heating.

For example, a single layer or stacked layers using silicon oxide, silicon oxynitride, silicon nitride oxide, silicon nitride, aluminum oxide, hafnium oxide, gallium oxide, a Ga—Zn oxide, or the like can be provided as the insulating layer 103.

In the case where a film other than an oxide film, e.g., a silicon nitride film, is used for the side of the insulating layer 103 that is in contact with the semiconductor layer 108, pretreatment such as oxygen plasma treatment is preferably performed on the surface in contact with the semiconductor layer 108 to oxidize the surface or the vicinity of the surface.

The gate electrode 112, the conductive layer 106 functioning as the gate electrode, and the conductive layer 120a and the conductive layer 120b functioning as the source electrode and the drain electrode can each be formed using a metal element selected from chromium, copper, aluminum, gold, silver, zinc, molybdenum, tantalum, titanium, tungsten, manganese, nickel, iron, and cobalt; an alloy containing any of these metal elements as its component; an alloy including a combination of any of these metal elements; or the like.

For the gate electrode 112, the conductive layer 106, the conductive layer 120a, and the conductive layer 120b, an oxide conductor (OC) or a metal oxide such as an In—Sn oxide, an In—W oxide, an In—W—Zn oxide, an In—Ti oxide, an In—Ti—Sn oxide, an In—Zn oxide, an In—Sn—Si oxide, or an In—Ga—Zn oxide can also be used.

Note that when an oxygen vacancy is formed in a metal oxide having semiconductor characteristics and hydrogen is added to the oxygen vacancy, a donor level is formed in the vicinity of the conduction band. As a result, the conductivity of the metal oxide is increased, so that the metal oxide becomes a conductor. The metal oxide having become a conductor can be referred to as an oxide conductor (OC).

The gate electrode 112 and the conductive layer 106 may each have a stacked-layer structure that includes a conductive film containing the above oxide conductor (metal oxide) and a conductive film containing a metal or an alloy. The use of the conductive film containing a metal or an alloy can reduce the wiring resistance. Note that a conductive film containing an oxide conductor is preferably used for the side of the gate electrode 112 that is in contact with the gate insulating layer 110 or the side of the conductive layer 106 that is in contact with the insulating layer 103.

Among the above-mentioned metal elements, it is particularly preferable that any one or more selected from titanium, tungsten, tantalum, and molybdenum be included in the gate electrode 112, the conductive layer 106, the conductive layer 120a, and the conductive layer 120b. In particular, a tantalum nitride film is preferably used. A tantalum nitride film is suitable as a conductive film that is in contact with the semiconductor layer 108 or a conductive film that is in the vicinity of the semiconductor layer 108 because a tantalum nitride film has conductivity, has a high barrier property against copper, oxygen, or hydrogen, and releases little hydrogen from itself.

As the gate insulating layer 110, an insulating layer including one or more of a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be used. Note that the gate insulating layer 110 is not limited to a single layer and may have a stacked-layer structure including two or more layers.

In the gate insulating layer 110, at least a region that is in contact with the semiconductor layer 108 is preferably an oxide insulating film and preferably includes a region containing oxygen in excess of that in the stoichiometric composition. In other words, the gate insulating layer 110 is an insulating film capable of releasing oxygen. For example, it is also possible to supply oxygen into the gate insulating layer 110 by forming the gate insulating layer 110 in an oxygen atmosphere, performing heat treatment, plasma treatment, or the like on the formed gate insulating layer 110 in an oxygen atmosphere, or forming an oxide film over the gate insulating layer 110 in an oxygen atmosphere.

For the gate insulating layer 110, a material having a larger dielectric constant than silicon oxide or silicon oxynitride, such as hafnium oxide, can also be used. In that case, the gate insulating layer 110 can be thick and leakage current due to tunnel current can be inhibited. Specifically, hafnium oxide having crystallinity is preferable because it has a higher dielectric constant than amorphous hafnium oxide.

The semiconductor layer 108 preferably contains an oxide semiconductor. Alternatively, the semiconductor layer 108 may contain silicon. Examples of silicon include amorphous silicon and crystalline silicon (e.g., low-temperature polysilicon or single crystal silicon).

The semiconductor layer 108 preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer 108.

In the case where the semiconductor layer 108 is an In—M—Zn oxide, examples of the atomic ratio of metal elements of a sputtering target for forming a film of an In—M—Zn oxide are In:M:Zn=1:1:1, In:M:Zn=1:1:1.2, In:M:Zn=1:3:2, In:M:Zn=1:3:4, In:M:Zn=1:3:6, In:M:Zn=2:1:3, In:M:Zn=3:1:2, In:M:Zn=4:2:4.1, In:M:Zn=5:1:6, In:M:Zn=5:1:7, In:M:Zn=5:1:8, In:M:Zn=6:1:6, In:M:Zn=5:2:5, and the like.

A target containing a polycrystalline oxide is preferably used as the sputtering target, in which case the semiconductor layer 108 having crystallinity is easily formed. Note that the atomic ratio in the semiconductor layer 108 to be formed varies in the range of ±40% from any of the above atomic ratios of the metal elements contained in the sputtering target. For example, in the case where the composition of a sputtering target used for the semiconductor layer 108 is In:Ga:Zn=4:2:4.1 [atomic ratio], the composition of the semiconductor layer 108 to be formed is in some cases in the neighborhood of In:Ga:Zn=4:2:3 [atomic ratio].

Note that when the atomic ratio is described as In:Ga:Zn=4:2:3 or as being in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. When the atomic ratio is described as In:Ga:Zn=5:1:6 or as being in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. When the atomic ratio is described as In:Ga:Zn=1:1:1 or as being in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

In the semiconductor layer 108, the atomic proportion of In is preferably higher than that of M (e.g., Ga), in which case the transistor can have increased field-effect mobility. In the semiconductor layer 108, the atomic proportion of M (e.g., Ga) is preferably higher than that of In, in which case oxygen vacancies are not easily formed.

The semiconductor layer 108 may include a plurality of metal oxide layers that are stacked. The semiconductor layer 108 may include two or more metal oxide layers with different crystallinities, for example.

For example, it is preferable that an In—M—Zn oxide film in which the atomic proportion of In is higher than that of M (e.g., Ga) be formed as an earlier-formed first metal oxide film and an In—M—Zn oxide film in which the atomic proportion of M (e.g., Ga) is higher than that of In be formed as a subsequently formed second metal oxide film. In that case, the transistor can have increased field-effect mobility and oxygen vacancies in the semiconductor layer 108 can be reduced, so that the transistor can have improved electrical characteristics and improved reliability.

Alternatively, it is preferable that a plurality of metal oxide layers be formed successively without exposure to the air with the use of the same sputtering target and different film formation conditions.

For example, the oxygen flow rate ratio at the time of forming the earlier-formed first metal oxide film is set smaller than that at the time of forming the subsequently formed second metal oxide film. Alternatively, a condition without oxygen flowing is employed at the time of forming the first metal oxide film. In such a manner, oxygen can be effectively supplied at the time of forming the second metal oxide film. The first metal oxide film can have lower crystallinity and higher electrical conductivity than the second metal oxide film. Meanwhile, owing to the second metal oxide film as the upper film having higher crystallinity than the first metal oxide film, damage caused at the time of processing the semiconductor layer 108 or forming the gate insulating layer 110 can be inhibited.

Specifically, the oxygen flow rate ratio at the time of forming the first metal oxide film is higher than or equal to 0% and lower than 50%, preferably higher than or equal to 0% and lower than or equal to 30%, further preferably higher than or equal to 0% and lower than or equal to 20%, typically 10%. The oxygen flow rate ratio at the time of forming the second metal oxide film is higher than or equal to 50% and lower than or equal to 100%, preferably higher than or equal to 60% and lower than or equal to 100%, further preferably higher than or equal to 80% and lower than or equal to 100%, still further preferably higher than or equal to 90% and lower than or equal to 100%, typically 100%. Although the conditions at the time of the film formation such as pressure, temperature, and power may vary between the first metal oxide film and the second metal oxide film, it is preferable to employ the same conditions other than the oxygen flow rate ratio, in which case the time required for the film formation steps can be shortened.

Here, oxygen vacancies that might be formed in the semiconductor layer 108 will be described.

Oxygen vacancies formed in the semiconductor layer 108 adversely affect the transistor characteristics and therefore cause a problem. For example, when an oxygen vacancy is formed in the semiconductor layer 108, the oxygen vacancy might be bonded with hydrogen to serve as a carrier supply source. The carrier supply source generated in the semiconductor layer 108 causes a change in the electrical characteristics, typically, a shift in the threshold voltage, of the transistor 100. Therefore, it is preferable that the amount of oxygen vacancies in the semiconductor layer 108 be as small as possible.

In view of this, in one embodiment of the present invention, the insulating films near the semiconductor layer 108, specifically, the gate insulating layer 110 positioned above the semiconductor layer 108 and the insulating layer 103 positioned below the semiconductor layer 108 each include an oxide film. When oxygen is moved from the insulating layer 103 and the gate insulating layer 110 to the semiconductor layer 108 by heat during the manufacturing process or the like, the amount of oxygen vacancies in the semiconductor layer 108 can be reduced.

A metal oxide that can be used for the semiconductor layer will be described below.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Note that in this specification and the like, "c-axis aligned crystal (CAAC)" or "cloud-aligned composite (CAC)" might be stated. Note that CAAC refers to an example of a crystal structure, and CAC refers to an example of a function or a material composition.

For example, a cloud-aligned composite oxide semiconductor (CAC-OS) can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

Oxide semiconductors (metal oxides) can be classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as a grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide; thus, it can be said that the CAAC-OS is a metal oxide that has small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity as compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be formed using either or both of an inert gas and an oxygen gas. Note that there is no particular limitation on the flow rate ratio of oxygen (the partial pressure of oxygen) at the time of forming the metal oxide film. However, to obtain a transistor having high field-effect mobility, the flow rate ratio of oxygen (the partial pressure of oxygen) at the time of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably 2 eV or more, further preferably 2.5 eV or more, still further preferably 3 eV or more. With the use of a metal oxide having such a wide energy gap, the off-state current of the transistor can be reduced.

[Manufacturing Method Example]

Next, a method for manufacturing the transistor of one embodiment of the present invention will be described with reference to FIGS. 5A to 5E, FIGS. 6A to 6C, FIGS. 7A to 7C, and FIGS. 8A and 8B. Here, a method for manufacturing the transistor 100A described in Structural Example 2 will be described. In FIGS. 5A to 5E, FIGS. 6A to 6C, FIGS. 7A to 7C, and FIGS. 8A and 8B, a cross section of the transistor in the channel length direction and that in the channel width direction in each step in the manufacturing process are shown side by side.

Note that thin films that form the semiconductor device (insulating films, semiconductor films, conductive films, and the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD) method and a thermal CVD method. In addition, as an example of the thermal CVD method, a metal organic chemical vapor deposition (MOCVD) method can be given.

The thin films that form the semiconductor device (insulating films, semiconductor films, conductive films, and the like) can be formed by a method such as spin coating, dipping, spray coating, ink-jetting, dispensing, screen printing, or offset printing or with a doctor knife, a slit coater, a roll coater, a curtain coater, or a knife coater.

When the thin films that form the semiconductor device are processed, a photolithography method or the like can be used for the processing. Alternatively, a nanoimprinting method, a sandblasting method, a lift-off method, or the like may be used for the processing of the thin films. Island-shaped thin films may be directly formed by a film formation method using a blocking mask such as a metal mask.

There are two typical examples of a photolithography method. In one of the methods, a resist mask is formed over a thin film that is to be processed, and the thin film is processed by etching or the like, so that the resist mask is removed. In the other method, after a photosensitive thin film is formed, exposure and development are performed, so that the thin film is processed into a desired shape.

For light for exposure in a photolithography method, for example, light with an i-line (with a wavelength of 365 nm), light with a g-line (with a wavelength of 436 nm), light with an h-line (with a wavelength of 405 nm), or combined light of any of them can be used. Besides, ultraviolet light, KrF laser light, ArF laser light, or the like can be used. Furthermore, exposure may be performed by liquid immersion light exposure technique. Furthermore, as the light used for the exposure, extreme ultra-violet (EUV) light or X-rays may be used. Furthermore, instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblast method, or the like can be used.

Figure 5A:
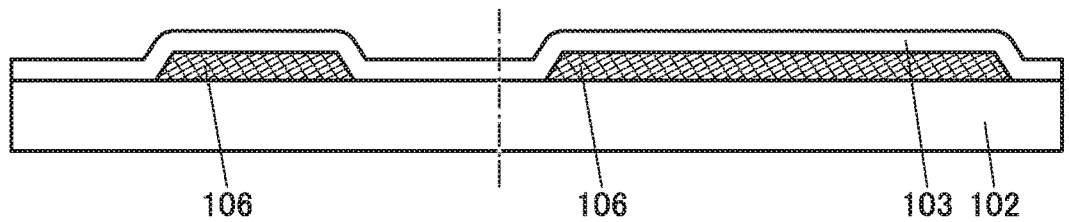
FIGS. 5A to 5E are cross-sectional views illustrating an example of a method for manufacturing a transistor.

First, a conductive film is formed over the substrate 102 and processed by etching, whereby the conductive layer 106 functioning as the gate electrode is formed as illustrated in FIG. 5A.

Then, the insulating layer 103 covering the substrate 102 and the conductive layer 106 is formed (FIG. 5A).

The structure of the insulating layer 103 will be described in more detail with reference to FIGS. 6A and 6B.

Figure 6A:
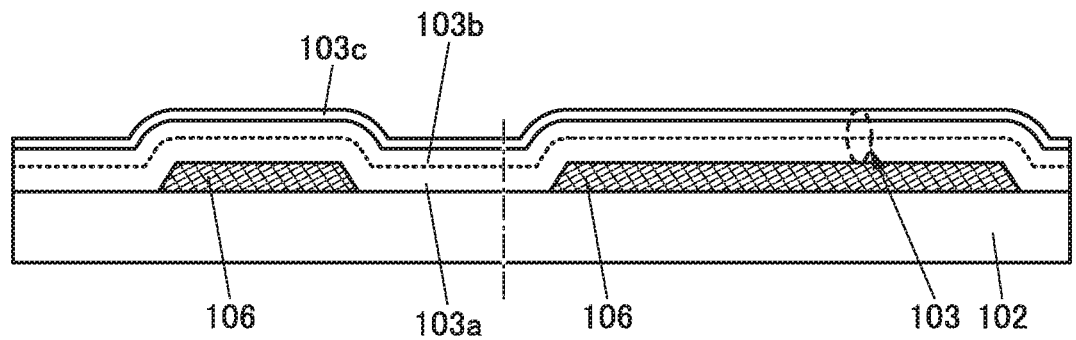
FIGS. 6A to 6C are cross-sectional views illustrating an example of a method for manufacturing a transistor.

The insulating layer 103 illustrated in FIG. 6A has a three-layer structure including an insulating layer 103a, an insulating layer 103b over the insulating layer 103a, and an insulating layer 103c over the insulating layer 103b.

Figure 6B:
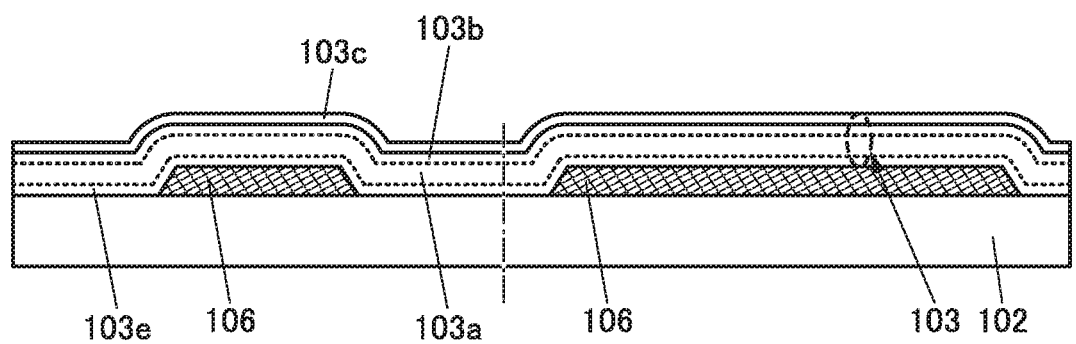

The insulating layer 103 illustrated in FIG. 6B has a four-layer structure including an insulating layer 103e, the insulating layer 103a over the insulating layer 103e, the insulating layer 103b over the insulating layer 103a, and the insulating layer 103c over the insulating layer 103b. The insulating layer 103 illustrated in FIG. 6B has a structure in which the insulating layer 103e is added to the insulating layer 103 in FIG. 6A.

The insulating layer 103a and the insulating layer 103b are preferably nitride insulating films that are formed under different conditions, and the insulating layer 103c is preferably an oxide insulating film. The insulating layer 103e is preferably a nitride insulating film formed under a condition different from that of each of the insulating layer 103a and the insulating layer 103b. The insulating layer 103e, the insulating layer 103a, the insulating layer 103b, and the insulating layer 103c are preferably formed successively without exposure to the air. The insulating layer 103e, the insulating layer 103a, the insulating layer 103b, and the insulating layer 103c are preferably formed by a plasma CVD method, for example.

As each of the insulating layer 103e, the insulating layer 103a, and the insulating layer 103b, a nitride insulating film such as a silicon nitride film, a silicon nitride oxide film, an aluminum nitride film, or a hafnium nitride film can be used. As the insulating layer 103c, an oxide insulating film such as a silicon oxide film, a silicon oxynitride film, a silicon nitride oxide film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used.

For example, it is preferable that a silicon nitride film be formed by a plasma CVD method as each of the insulating layer 103e, the insulating layer 103a, and the insulating layer 103b, and a silicon oxynitride film be formed by a plasma CVD method as the insulating layer 103c.

The insulating layer 103a is desirably a film with a high withstand voltage and a low stress. When the insulating layer 103 includes a film with a low stress, warpage of the substrate can be inhibited. Thus, easy transfer is achieved even when a large-sized substrate is used, and the manufacturing time can be shortened and the manufacturing yield can be improved. The insulating layer 103a is preferably formed to be thicker than each of the insulating layer 103e and the insulating layer 103b. In that case, the productivity of the insulating layer 103 can be improved.

The insulating layer 103e and the insulating layer 103b are each a dense film that can prevent diffusion of an impurity from the substrate 102 side.

Specifically, the insulating layer 103e desirably has a high blocking property against the metal element contained in the conductive layer 106. For example, in the case where copper is used for the conductive layer 106, the insulating layer 103e is preferably provided to inhibit diffusion of copper to the semiconductor layer 108. Note that in the case where the conductive layer 106 is formed using a metal element that does not easily diffuse to the insulating layer 103, for example, the insulating layer 103e is not necessarily provided.

The insulating layer 103b desirably releases a small amount of hydrogen and has a high blocking property against hydrogen. When hydrogen is released from the insulating layer 103, the hydrogen is bonded to oxygen in the semiconductor layer 108 and is desorbed as water, which might form an oxygen vacancy in the semiconductor layer 108. When hydrogen enters the oxygen vacancy, a donor is formed and the carrier density increases. When release of hydrogen from the insulating layer 103 is inhibited, a variation in the transistor characteristics can be inhibited and the reliability can be increased.

For example, when one or both of the pressure and power at the time of formation of the insulating layer 103a is set to be lower than that in the film formation condition of the insulating layer 103b, the stress of the insulating layer 103a can be lower than that of the insulating layer 103b. In addition, the insulating layer 103b can be a film having a higher blocking property against hydrogen than the insulating layer 103a.

The insulating layer 103c is in contact with the semiconductor layer 108. The insulating layer 103c is preferably an extremely dense film whose surface has few defects and on the surface of which an impurity contained in the air such as water is not easily adsorbed.

At least a source gas containing a deposition gas is used as the film formation gas used for formation of the layers included in the insulating layer 103. The film formation gas may contain a dilution gas such as argon, helium, or nitrogen in addition to the source gas. When the proportion of the flow rate of the deposition gas in the total flow rate of the film formation gas (hereinafter also simply referred to as a flow rate ratio) is low, the film formation speed can be made low, which allows formation of a dense film with few defects.

The insulating layer 103a is preferably formed under conditions where the flow rate ratio of the deposition gas is higher than that for the insulating layer 103b. This can increase the film formation speed of the insulating layer 103a and improve the productivity of the insulating layer 103.

The insulating layer 103b and the insulating layer 103e are each preferably formed under conditions where the flow rate ratio of the deposition gas is lower than that for the insulating layer 103a. This allows a dense film with few defects to be formed as each of the insulating layer 103b and the insulating layer 103e.

Here, the boundary between the insulating layer 103a and the insulating layer 103b and the boundary between the insulating layer 103e and the insulating layer 103a are sometimes unclear and thus are clearly shown by dashed lines in FIG. 6A and FIG. 6B. Note that since the insulating layer 103a and the insulating layer 103b have different film densities, the boundary therebetween can be observed as a difference in contrast in a transmission electron microscope (TEM) image or the like of a cross section of the insulating layer 103 in some cases. Similarly, the boundary between the insulating layer 103e and the insulating layer 103a can be observed in some cases.

After the insulating layer 103 is formed, treatment for supplying oxygen to the insulating layer 103 may be performed. As examples of the treatment for supplying oxygen, plasma treatment in an oxygen atmosphere, heat treatment in an oxygen atmosphere, treatment using a plasma ion doping method, treatment using an ion implantation method, and the like can be given.

Figure 5B:
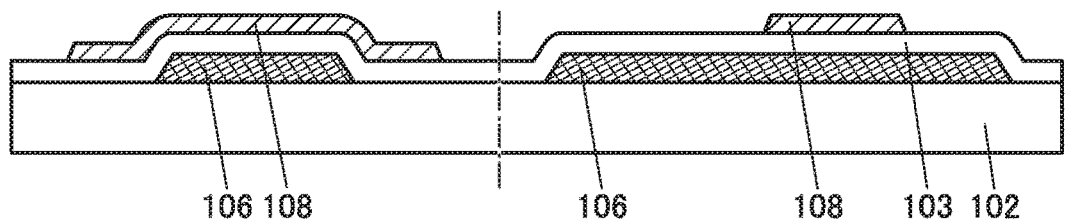

Next, a metal oxide film is formed over the insulating layer 103 and processed to form the island-like semiconductor layer 108 (FIG. 5B).

The metal oxide film is preferably formed by a sputtering method using a metal oxide target.

In forming the metal oxide film, an oxygen gas is preferably used. In forming the metal oxide film, an inert gas (e.g., a helium gas, an argon gas, or a xenon gas) may be mixed in addition to the oxygen gas. Note that when the proportion of an oxygen gas in the whole film formation gas (hereinafter also referred to as an oxygen flow rate ratio) at the time of forming the metal oxide film is higher, the crystallinity of the metal oxide film can be higher and a transistor with higher reliability can be obtained. On the other hand, when the oxygen flow rate ratio is lower, the crystallinity of the metal oxide film is lower and a transistor with a high on-state current can be obtained.

The metal oxide film is formed under the film formation conditions where the substrate temperature is higher than or equal to room temperature and lower than or equal to 200° C., preferably higher than or equal to room temperature and lower than or equal to 140° C. For example, when the substrate temperature is higher than or equal to room temperature and lower than 140° C., high productivity is achieved, which is preferable. When the metal oxide film is formed with the substrate temperature set at room temperature or without intentional heating, the crystallinity can be made low.

It is preferable to perform treatment for desorbing water, hydrogen, a component of an organic substance, or the like adsorbed onto a surface of the insulating layer 103 or treatment for supplying oxygen into the insulating layer 103 before formation of the metal oxide film. For example, heat treatment can be performed at a temperature higher than or equal to 70° C. and lower than or equal to 200° C. in a reduced-pressure atmosphere. Alternatively, plasma treatment may be performed in an oxygen-containing atmosphere. When plasma treatment is performed in an atmosphere containing a nitrogen monoxide ($N_2O$) gas, an organic substance on the surface of the insulating layer 103 can be favorably removed. After such treatment, the metal oxide film is preferably formed successively without exposure of the surface of the insulating layer 103 to the air.

For processing of the metal oxide film, one or both of a wet etching method and a dry etching method can be used. At this time, part of the insulating layer 103 that does not overlap with the semiconductor layer 108 is etched and thinned in some cases.

After the metal oxide film is formed or processed into the semiconductor layer 108, heat treatment may be performed to remove hydrogen or water in the metal oxide film or the semiconductor layer 108. The temperature of the heat treatment can be typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an atmosphere containing a rare gas or nitrogen. Alternatively, heating may be performed in the atmosphere, and then heating may be performed in an oxygen-containing atmosphere. It is preferable that the atmosphere of the above heat treatment not contain hydrogen, water, or the like. An electric furnace, an RTA apparatus, or the like can be used for the heat treatment. The use of the RTA apparatus can shorten the heat treatment time.

Figure 5C:
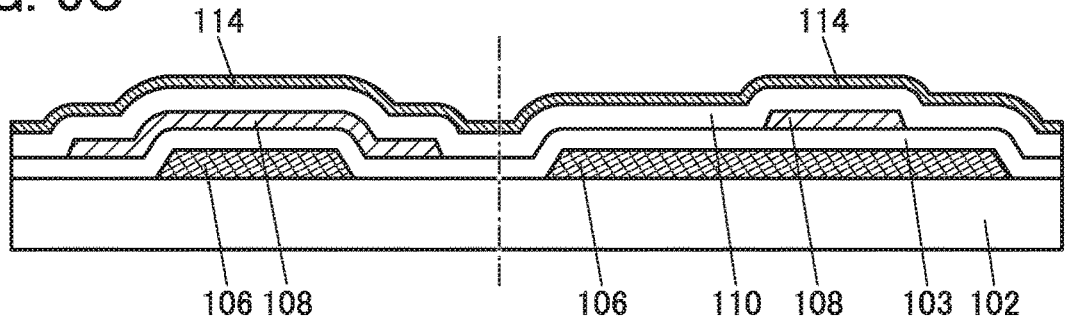

Next, a stack of the gate insulating layer 110 and a metal oxide layer 114 is formed to cover the insulating layer 103 and the semiconductor layer 108 (FIG. 5C).

It is preferable to perform plasma treatment on a surface of the semiconductor layer 108 before formation of the gate insulating layer 110. In that case, an impurity adsorbed onto the surface of the semiconductor layer 108, such as water, can be removed. Since impurities present at the interface between the semiconductor layer 108 and the gate insulating layer 110 can be reduced, the transistor can have increased reliability. Performing the plasma treatment in this manner is particularly favorable in the case where the surface of the semiconductor layer 108 is exposed to the air after the formation of the semiconductor layer 108 and before the formation of the gate insulating layer 110. For example, plasma treatment can be performed in an atmosphere containing oxygen, ozone, nitrogen, dinitrogen monoxide ($N_2O$), argon, or the like. The plasma treatment is preferably performed in an oxygen-containing atmosphere. When $N_2O$ plasma treatment is performed, an organic substance on the surface of the semiconductor layer 108 can be favorably removed. After the plasma treatment, the gate insulating layer 110 is preferably formed successively without exposure of the surface of the semiconductor layer 108 to the air.

As the gate insulating layer 110, for example, an oxide film such as a silicon oxide film or a silicon oxynitride film is preferably formed by a plasma CVD method. The gate insulating layer 110 may be formed by a PECVD method using a microwave.

The structure of the gate insulating layer 110 will be described in more detail with reference to FIG. 6C.

Figure 6C:
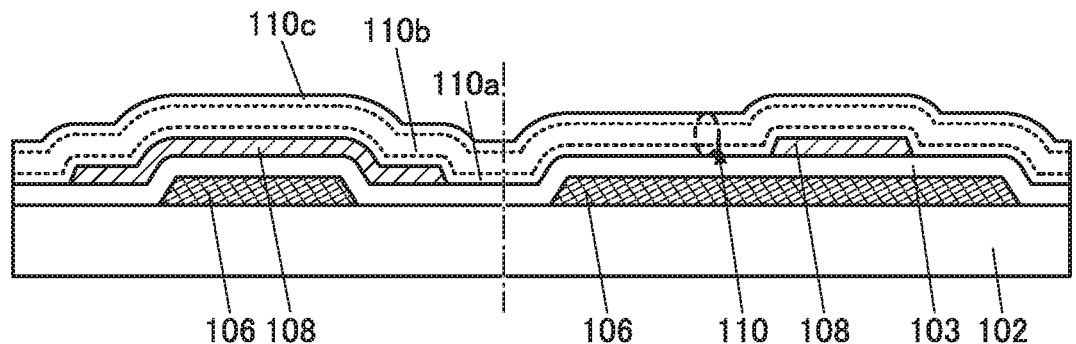

The gate insulating layer 110 illustrated in FIG. 6C has a three-layer structure including an insulating layer 110a, an insulating layer 110b over the insulating layer 110a, and an insulating layer 110c over the insulating layer 110b.

The insulating layer 110a, the insulating layer 110b, and the insulating layer 110c are preferably oxide insulating films that are formed under different conditions. In that case, the insulating layer 110a, the insulating layer 110b, and the insulating layer 110c are preferably formed successively with the same film formation apparatus. For example, silicon oxynitride films are preferably formed as the insulating layer 110a, the insulating layer 110b, and the insulating layer 110c by a plasma CVD method.

The insulating layer 110a is in contact with the semiconductor layer 108. The film formation speed (also referred to as film formation rate) of the insulating layer 110a is preferably low so that damage to the semiconductor layer 108 at the time of formation of the insulating layer 110a is reduced.

The insulating layer 110a is preferably formed under conditions where the power is lower than that for the insulating layer 110b. In that case, damage to the semiconductor layer 108 can be extremely small.

The insulating layer 110a desirably has few defects and releases small amounts of hydrogen and water. In that case, formation of oxygen vacancies in the semiconductor layer 108 can be suppressed.

The film formation speed of the insulating layer 110b is preferably high to increase the productivity of the gate insulating layer 110. The insulating layer 110b is preferably provided to be thicker than each of the insulating layer 110a and the insulating layer 110c.

The insulating layer 110c is preferably an extremely dense film whose surface has few defects and on the surface of which an impurity contained in the air such as water is not easily adsorbed.

At least a source gas containing a deposition gas is used as the film formation gas used for formation of the layers included in the gate insulating layer 110. The film formation gas may contain a dilution gas such as argon, helium, or nitrogen in addition to the source gas. When the proportion of the flow rate of the deposition gas in the total flow rate of the film formation gas (hereinafter also simply referred to as a flow rate ratio) is low, the film formation speed can be made low, which allows formation of a dense film with few defects.

For example, a source gas that contains a silicon-containing deposition gas such as silane or disilane and an oxidizing gas such as oxygen, ozone, dinitrogen monoxide, or nitrogen dioxide can be used for formation of a silicon oxynitride film.

The insulating layer 110a is preferably formed under conditions where the flow rate ratio of the deposition gas is lower than that for the insulating layer 110b. In that case, a dense film with few defects can be formed as the insulating layer 110a.

The insulating layer 110b is preferably formed under conditions where the flow rate ratio of the deposition gas is higher than that for one or both of the insulating layer 110a and the insulating layer 110c. This can increase the film formation speed of the insulating layer 110b and improve the productivity of the gate insulating layer 110.

In a manner similar to that of the insulating layer 110a, the insulating layer 110c is preferably formed under conditions where the flow rate ratio of the deposition gas is lower than that for the insulating layer 110b. Note that since the insulating layer 110c is formed over the semiconductor layer 108 with the insulating layer 110a and the insulating layer 110b therebetween, damage to the semiconductor layer 108 at the time of the formation of the insulating layer 110c is small. Thus, the insulating layer 110c can be formed under conditions where the power is higher than that for the insulating layer 110a. When the flow rate ratio of the deposition gas is low and the power is relatively high in the film formation, a dense film with few surface defects can be formed as the insulating layer 110c.

Here, the boundary between the insulating layer 110a and the insulating layer 110b and the boundary between the insulating layer 110b and the insulating layer 110c are sometimes unclear and thus are clearly shown by dashed lines in FIG. 6C. Note that since the insulating layer 110a and the insulating layer 110b have different film densities, the boundary therebetween can be observed as a difference in contrast in a TEM image or the like of a cross section of the gate insulating layer 110 in some cases. Similarly, the boundary between the insulating layer 110b and the insulating layer 110c can be observed in some cases.

The metal oxide layer 114 is formed using a material that does not easily transmit oxygen and hydrogen. The metal oxide layer 114 has a function of inhibiting diffusion of the oxygen contained in the gate insulating layer 110 to the side opposite to the semiconductor layer 108. The metal oxide layer 114 has a function of inhibiting diffusion of hydrogen and water from the outside to the gate insulating layer 110 side. The metal oxide layer 114 is preferably formed using a material that is less likely to transmit oxygen and hydrogen than at least the gate insulating layer 110.

The metal oxide layer 114 may be either an insulating layer or a conductive layer.

The metal oxide layer 114 is preferably formed using an insulating material with a higher dielectric constant than that of silicon oxide. For example, an aluminum oxide film, a hafnium oxide film, a hafnium aluminate film, or the like can be used.

For the metal oxide layer 114, for example, a conductive oxide such as indium oxide, indium tin oxide (ITO), or indium tin oxide containing silicon (ITSO) can also be used.

For the metal oxide layer 114, an oxide material containing one or more elements that are the same as those of the semiconductor layer 108 is preferably used. It is particularly preferable to use an oxide semiconductor material that can be used for the semiconductor layer 108. At this time, a metal oxide film formed using the sputtering target which is the same as that for the semiconductor layer 108 is preferably used for the metal oxide layer 114, in which case the same apparatus can be used.

Alternatively, when both the semiconductor layer 108 and the metal oxide layer 114 are formed using a metal oxide material containing indium and gallium, a material whose proportion (content ratio) of gallium is higher than that in the semiconductor layer 108 is preferably used, in which case the blocking property against oxygen can be further increased. Here, when the semiconductor layer 108 is formed using a material whose proportion of indium is higher than that in the metal oxide layer 114, the field-effect mobility of the transistor 100 can be increased.

The metal oxide layer 114 is preferably formed using a sputtering apparatus. For example, in the case where an oxide film is formed using a sputtering apparatus, forming the oxide film in an atmosphere containing an oxygen gas can favorably supply oxygen into the gate insulating layer 110 or the semiconductor layer 108.

The metal oxide layer 114 is preferably formed in, for example, an oxygen-containing atmosphere. It is particularly preferable that the metal oxide layer 114 be formed by a sputtering method in an oxygen-containing atmosphere. In that case, oxygen can be supplied to the gate insulating layer 110 at the time of the formation of the metal oxide layer 114.

In the case where the metal oxide layer 114 is formed by a sputtering method using an oxide target containing a metal oxide similar to that used for forming the semiconductor layer 108, the above-described method can be referred to.

For example, the metal oxide layer 114 may be formed by a reactive sputtering method using oxygen as a film formation gas and a metal target. When aluminum is used for the metal target, for instance, an aluminum oxide film can be formed.

At the time of forming the metal oxide layer 114, a larger amount of oxygen can be supplied into the gate insulating layer 110 with a higher proportion of the oxygen flow rate to the total flow rate of the film formation gas introduced into a film formation chamber of a film formation apparatus (a higher oxygen flow rate ratio), or with a higher oxygen partial pressure in the film formation chamber. The oxygen flow rate ratio or the oxygen partial pressure is, for example, higher than or equal to 50% and lower than or equal to 100%, preferably higher than or equal to 65% and lower than or equal to 100%, further preferably higher than or equal to 80% and lower than or equal to 100%, still further preferably higher than or equal to 90% and lower than or equal to 100%. It is particularly preferred that the oxygen flow rate ratio be 100% and the oxygen partial pressure be as close to 100% as possible.

When the metal oxide layer 114 is formed by a sputtering method in an oxygen-containing atmosphere in the above manner, oxygen can be supplied to the gate insulating layer 110 and release of oxygen from the gate insulating layer 110 can be prevented during the formation of the metal oxide layer 114. As a result, an extremely large amount of oxygen can be enclosed in the gate insulating layer 110. Moreover, a large amount of oxygen can be supplied to the semiconductor layer 108 by heat treatment performed later. Thus, the amount of oxygen vacancies in the semiconductor layer 108 can be reduced, leading to a highly reliable transistor.

Next, heat treatment is preferably performed to supply oxygen from the gate insulating layer 110 to the semiconductor layer 108. The heat treatment can be performed at a temperature higher than or equal to 200° C. and lower than or equal to 400° C. in an atmosphere containing one or more of nitrogen, oxygen, and a rare gas.

When heat treatment is performed after formation of the metal oxide layer 114 and before formation of the gate electrode 112, oxygen can be effectively supplied from the gate insulating layer 110 to the semiconductor layer 108.

Figure 5D:
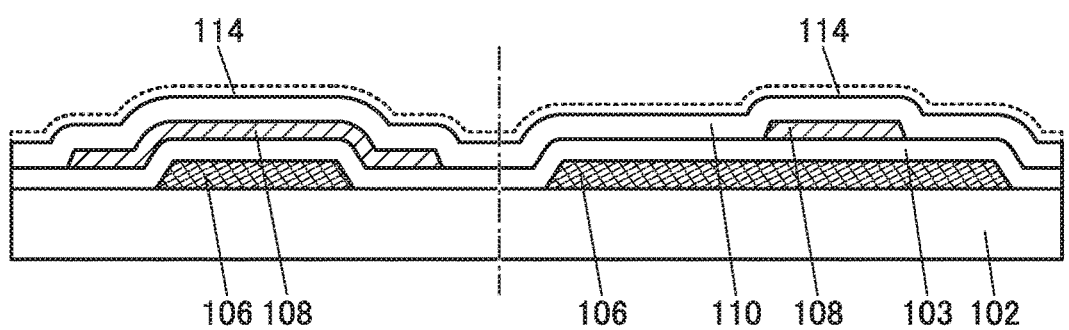

Then, the metal oxide layer 114 is removed (FIG. 5D). Note that the steps after removal of the metal oxide layer 114 are each preferably performed at a temperature lower than or equal to the temperature of the above heat treatment. In this manner, desorption of oxygen in the semiconductor layer 108 can be inhibited, which can inhibit formation of oxygen vacancies in the semiconductor layer 108. As a result, the reliability of the transistor can be increased.

There is no particular limitation on the method by which the metal oxide layer 114 is removed; the use of wet etching can inhibit the gate insulating layer 110 from being etched at the same time as the metal oxide layer 114. In that case, a reduction in the thickness of the gate insulating layer 110 can be inhibited and the thickness of the gate insulating layer 110 can be uniform.

After the metal oxide layer 114 is removed, the gate insulating layer 110 and the insulating layer 103 are partly etched, whereby the opening portion 142 reaching the conductive layer 106 is formed. Accordingly, the gate electrode 112 to be formed later can be electrically connected to the conductive layer 106 through the opening portion 142. Note that the opening portion 142 may be formed before the metal oxide layer 114 is formed.

Figure 5E:
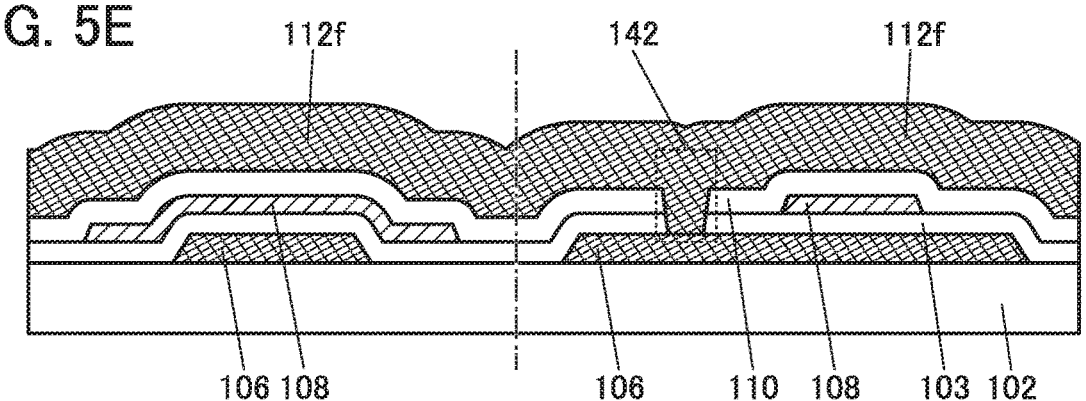

Next, a conductive film 112f to be the gate electrode 112 is formed over the gate insulating layer 110 (FIG. 5E). The conductive film 112f is preferably formed by a sputtering method using a sputtering target of a metal or an alloy. Here, the conductive film 112f and the conductive layer 106 are connected to each other through the opening portion 142.

Figure 7A:
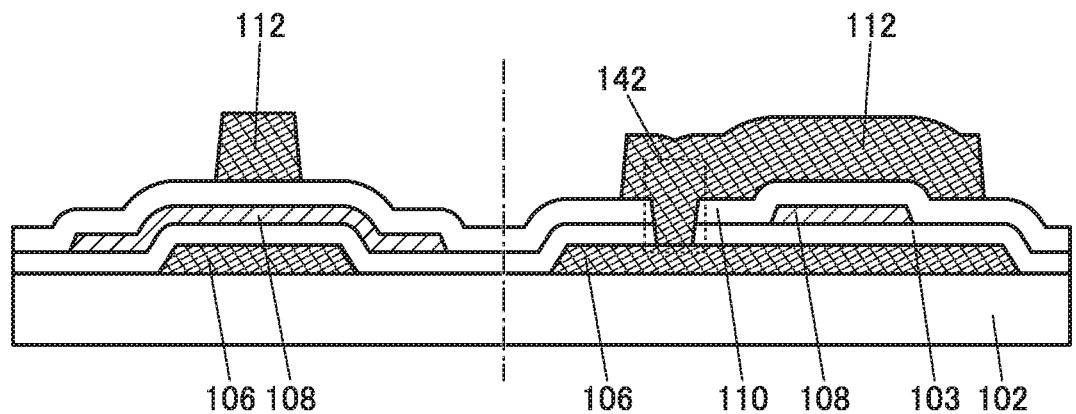
FIGS. 7A to 7C are cross-sectional views illustrating an example of a method for manufacturing a transistor.

Next, the conductive film 112f is partly etched to form the gate electrode 112 (FIG. 7A).

When the gate insulating layer 110 covers the top surface and the side surface of the semiconductor layer 108 as well as the insulating layer 103 in this manner, it is possible to prevent the semiconductor layer 108 and the insulating layer 103 from being partly etched and thinned at the time of the etching for forming the gate electrode 112.

Figure 7B:
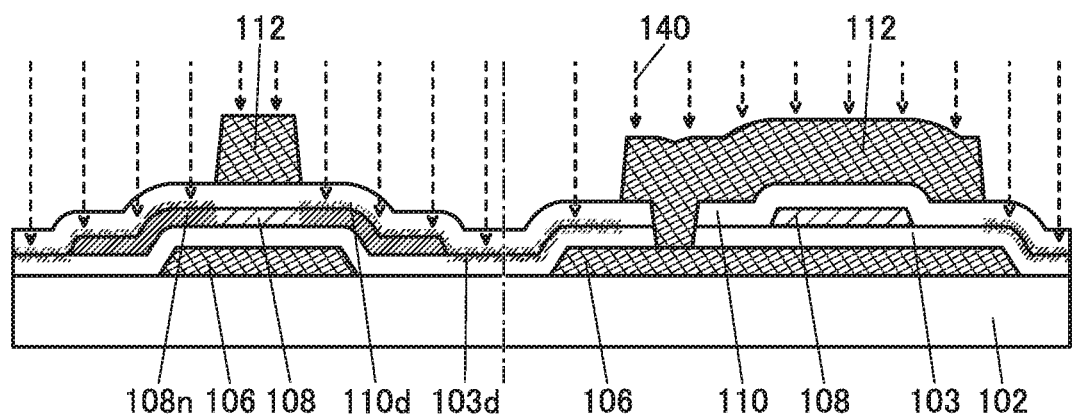
Figure 7C:
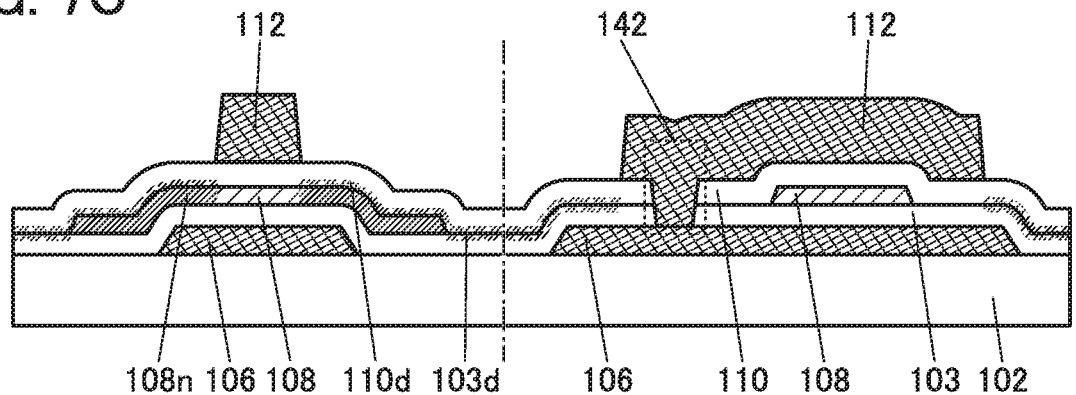

Then, treatment for supplying an impurity element 140 to the gate insulating layer 110 and the semiconductor layer 108 is performed with the use of the gate electrode 112 as a mask, whereby the low-resistance region 108n, the region 110d, and the region 103d are formed (FIG. 7B and FIG. 7C). In the semiconductor layer 108 and the gate insulating layer 110, regions overlapping with the gate electrode 112 are not supplied with the impurity element 140 owing to the gate electrode 112 serving as the mask.

A plasma ion doping method or an ion implantation method can be suitably used for the supply of the impurity element 140. In these methods, the concentration profile in the depth direction can be controlled with high accuracy by the acceleration voltage and the dosage of ions, or the like. The use of a plasma ion doping method can increase productivity. When an ion implantation method using mass separation is employed, the purity of an impurity element to be supplied can be increased.

In the treatment for supplying the impurity element 140, the treatment conditions are preferably controlled such that the concentration is the highest at the interface between the semiconductor layer 108 and the gate insulating layer 110, a portion in the semiconductor layer 108 near the interface, or a portion in the gate insulating layer 110 near the interface. Accordingly, the impurity element 140 can be supplied at optimal concentrations to both the semiconductor layer 108 and the gate insulating layer 110 in one treatment.

Examples of the impurity element 140 include hydrogen, boron, carbon, nitrogen, fluorine, phosphorus, sulfur, arsenic, aluminum, magnesium, silicon, and a rare gas. As the impurity element 140, boron, phosphorus, aluminum, magnesium, or silicon is preferably used, and boron or phosphorus is further preferably used.

As a source gas of the impurity element 140, a gas containing any of the above impurity elements can be used. In the case where boron is supplied, typically, a $B_2H_6$ gas, a $BF_3$ gas, or the like can be used. In the case where phosphorus is supplied, typically, a $PH_3$ gas can be used. A mixed gas in which any of these source gases is diluted with a rare gas may be used.

Besides, any of $CH_4$, $N_2$, $NH_3$, $AlH_3$, $AlCl_3$, $SiH_4$, $Si_2H_6$, $F_2$, HF, $H_2$, $(C_5H_5)_2Mg$, a rare gas, and the like can be used as the source gas. The ion source is not limited to a gas, and a solid or a liquid may be vaporized by being heated.

Supply of the impurity element 140 can be controlled by setting the conditions such as the accelerating voltage and the dosage in consideration of the composition, the density, the thickness, or the like of the gate insulating layer 110 and the semiconductor layer 108.

Note that there is no limitation on the method for supplying the impurity element 140, and for example, plasma treatment, treatment using thermal diffusion by heating, or the like may be used. In the case of a plasma treatment method, an impurity element can be supplied in such a manner that plasma is generated in a gas atmosphere containing the impurity element to be supplied and plasma treatment is performed. A dry etching apparatus, an ashing apparatus, a plasma CVD apparatus, a high-density plasma CVD apparatus, or the like can be used as an apparatus for generating the plasma.

In one embodiment of the present invention, the impurity element 140 can be supplied to the semiconductor layer 108 through the gate insulating layer 110. Owing to this, the crystallinity of the semiconductor layer 108 can be inhibited from decreasing at the time of supply of the impurity element 140. Therefore, this is particularly suitable for the case where a reduction in crystallinity increases the electric resistance.

In the step of supplying the impurity element 140, the impurity element 140 is also supplied to a portion of the gate insulating layer 110 that does not overlap with the gate electrode 112. As a result, there is a difference in ease of heating-induced oxygen release between the portion of the gate insulating layer 110 that overlaps with the gate electrode 112 and the portion of the gate insulating layer 110 that does not overlap with the gate electrode 112. Therefore, oxygen can be inhibited from being supplied from the gate insulating layer 110 to the low-resistance region 108n even in the case where heat treatment is performed after the step of supplying the impurity element 140, which can inhibit an increase in the electric resistance of the low-resistance region 108n.

Figure 8A:
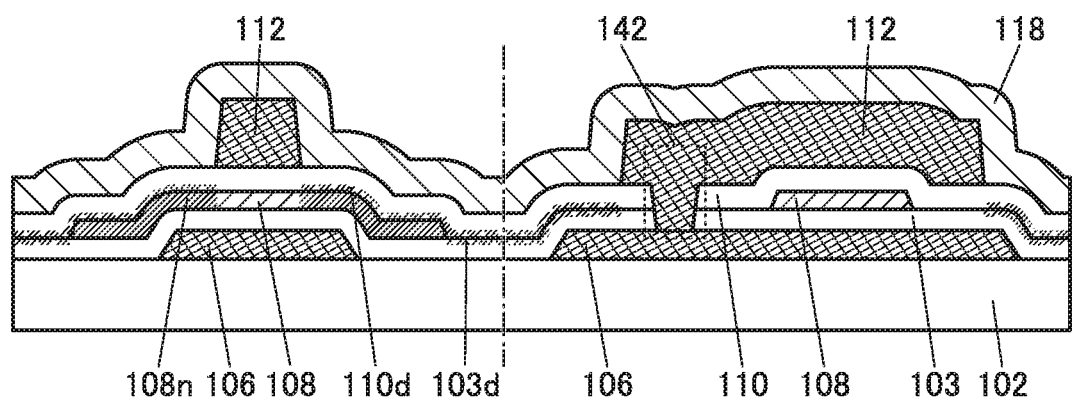
FIGS. 8A and 8B are cross-sectional views illustrating an example of a method for manufacturing a transistor.

Next, the insulating layer 118 that covers the gate insulating layer 110 and the gate electrode 112 is formed (FIG. 8A).

In the case where the insulating layer 118 is formed by a plasma CVD method, too high a film formation temperature might cause diffusion of the impurity contained in the low-resistance region 108n to a surrounding portion including the channel formation region of the semiconductor layer 108 or might increase the electric resistance of the low-resistance region 108n. The film formation temperature of the insulating layer 118 is preferably higher than or equal to 150° C. and lower than or equal to 400° C., further preferably higher than or equal to 180° C. and lower than or equal to 360° C., still further preferably higher than or equal to 200° C. and lower than or equal to 250° C., for example. Formation of the insulating layer 118 at low temperatures enables the transistor to have favorable electrical characteristics even when it has a short channel length.

Subsequently, a mask is formed by lithography in a desired position of the insulating layer 118, and then the insulating layer 118 and the gate insulating layer 110 are partly etched, so that the opening portion 141a and the opening portion 141b reaching the low-resistance regions 108n are formed.

Figure 8B:
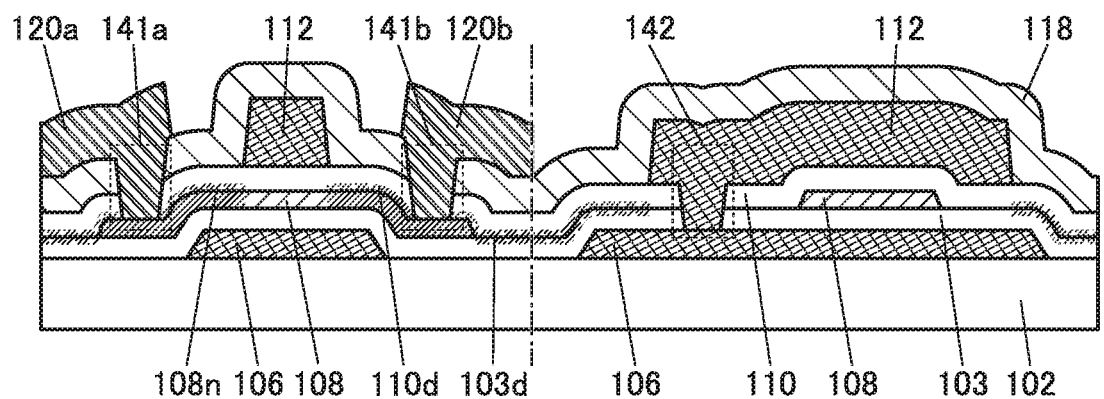

Next, a conductive film is formed over the insulating layer 118 so as to cover the opening portion 141a and the opening portion 141b, and the conductive film is processed into a desired shape, whereby the conductive layer 120a and the conductive layer 120b are formed (FIG. 8B).

Through the above process, the transistor 100A can be manufactured. In the case where the transistor 100A is applied to a pixel of a display device, for example, this process may be followed by a process for forming one or more of a protective insulating layer, a planarization layer, a display element, and a wiring.

In the manufacturing method of the semiconductor device in this embodiment, heat treatment is performed after the semiconductor layer, the gate insulating layer, and the metal oxide layer are formed and before the gate electrode is formed. Since the metal oxide layer that does not easily transmit oxygen is provided over the gate insulating layer, oxygen can be effectively supplied from the gate insulating layer to the semiconductor layer. Accordingly, oxygen vacancies in the channel formation region of the semiconductor layer can be reduced and the reliability of the transistor can be improved. The metal oxide layer is removed after the heat treatment and before formation of the gate electrode. It is thus possible to inhibit degradation of the transistor characteristics due to processing and leaving of the metal oxide layer. As a result, a semiconductor device with favorable electrical characteristics and high reliability can be provided.

This embodiment can be combined with the other embodiments as appropriate. In this specification, in the case where a plurality of structure examples are shown in one embodiment, the structure examples can be combined as appropriate.

Embodiment 2

In this embodiment, display devices that include the semiconductor device of one embodiment of the present invention will be described with reference to FIGS. 9A to 9C, FIG. 10, FIG. 11, FIG. 12, and FIG. 13.

Since the semiconductor device of one embodiment of the present invention has favorable electrical characteristics, a display device can have increased reliability by using the semiconductor device. For example, the transistor of one embodiment of the present invention can be applied to transistors included in one or both of a pixel and a driver circuit of the display device.

The semiconductor device of one embodiment of the present invention can be used for a display device or a module including the display device. Examples of the module including the display device are a module in which a connector such as a flexible printed circuit board (hereinafter referred to as an FPC) or a tape carrier package (TCP) is attached to the display device, a module which is mounted with an integrated circuit (IC) by a chip on glass (COG) method, a chip on film (COF) method, or the like, and the like.

[Top Structure of Display Device]

Figure 9A:
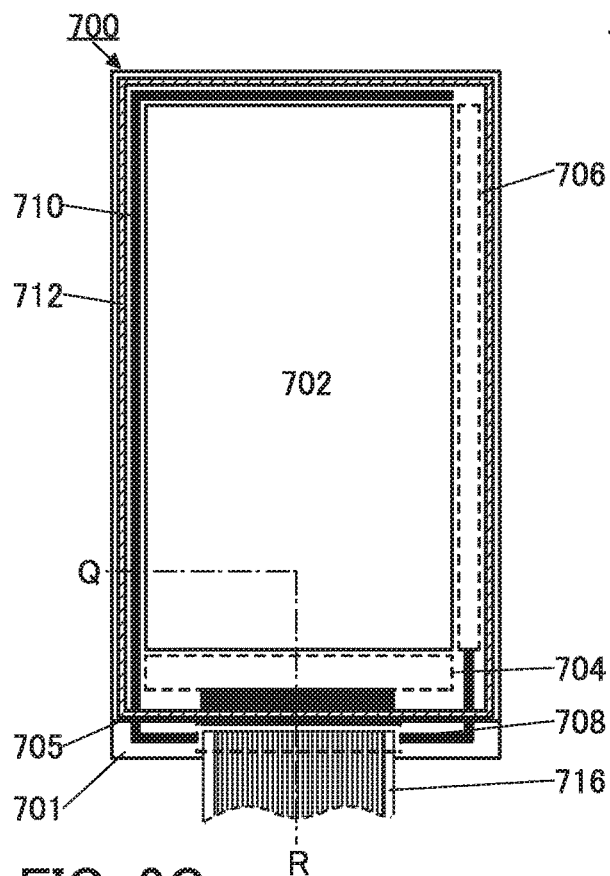
FIGS. 9A to 9C are top views illustrating examples of display devices.

FIG. 9A shows a top view of a display device 700. The display device 700 includes a first substrate 701 and a second substrate 705 that are bonded to each other with a sealant 712. A pixel portion 702, a source driver 704, and a gate driver 706 are provided in the region sealed by the first substrate 701, the second substrate 705, and the sealant 712. In the pixel portion 702, a plurality of display elements are provided.

A portion of the first substrate 701 that does not overlap with the second substrate 705 is provided with an FPC terminal portion 708 to which an FPC 716 is connected. The FPC 716 supplies a variety of signals to the pixel portion 702, the source driver 704, and the gate driver 706 through the FPC terminal portion 708 and a signal line 710.

A plurality of the gate drivers 706 may be provided. Each of the gate driver 706 and the source driver 704 may be formed separately over a semiconductor substrate or the like and may be in the form of a packaged IC chip. The IC chip can be mounted over the first substrate 701 or on the FPC 716.

The transistor of one embodiment of the present invention can be applied to transistors included in the pixel portion 702, the source driver 704, and the gate driver 706.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. As an example of the light-emitting element, a self-luminous light-emitting element such as a light-emitting diode (LED), an organic LED (OLED), a quantum-dot LED (QLED), or a semiconductor laser can be given. Moreover, a micro electro mechanical systems (MEMS) shutter element, an optical interference type MEMS element, or a display element using a microcapsule method, an electrophoretic method, an electrowetting method, an Electronic Liquid Powder (registered trademark) method, or the like can also be used, for instance.

Figure 9B:
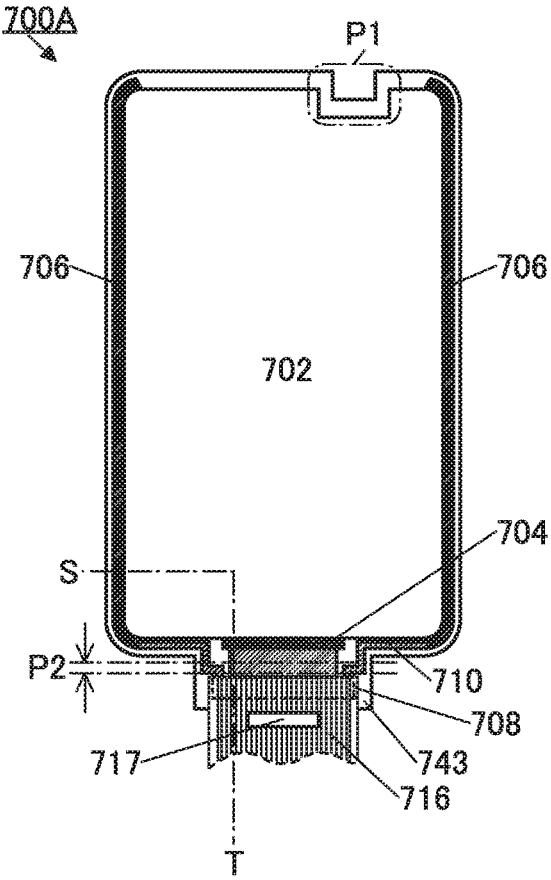

A display device 700A illustrated in FIG. 9B is an example of a display device that uses a flexible resin layer 743 instead of the first substrate 701 and that can be used as a flexible display.

In the display device 700A, the pixel portion 702 does not have a rectangular shape but has arc-shaped corner portions. As shown by a region P1 in FIG. 9B, the display device 700A includes a notch, where the pixel portion 702 and the resin layer 743 are partly cut. A pair of the gate drivers 706, between which the pixel portion 702 is sandwiched, are provided on both sides. The gate driver 706 is provided along an arc contour at the corner portion of the pixel portion 702.

The resin layer 743 has a shape in which a portion provided with the FPC terminal portion 708 is projected. A portion of the resin layer 743 that includes the FPC terminal portion 708 can be folded back toward the rear side at a region P2 in FIG. 9B. When the portion of the resin layer 743 is folded back, the display device 700A can be mounted on an electronic device with the FPC 716 overlapping with the rear side of the pixel portion 702, so that the space of the electronic device can be saved.

The FPC 716 connected to the display device 700A is mounted with an IC 717. The IC 717 functions as a source driver, for example. In this case, the source driver 704 in the display device 700A can include at least one of a protection circuit, a buffer circuit, a demultiplexer circuit, and the like.

Figure 9C:
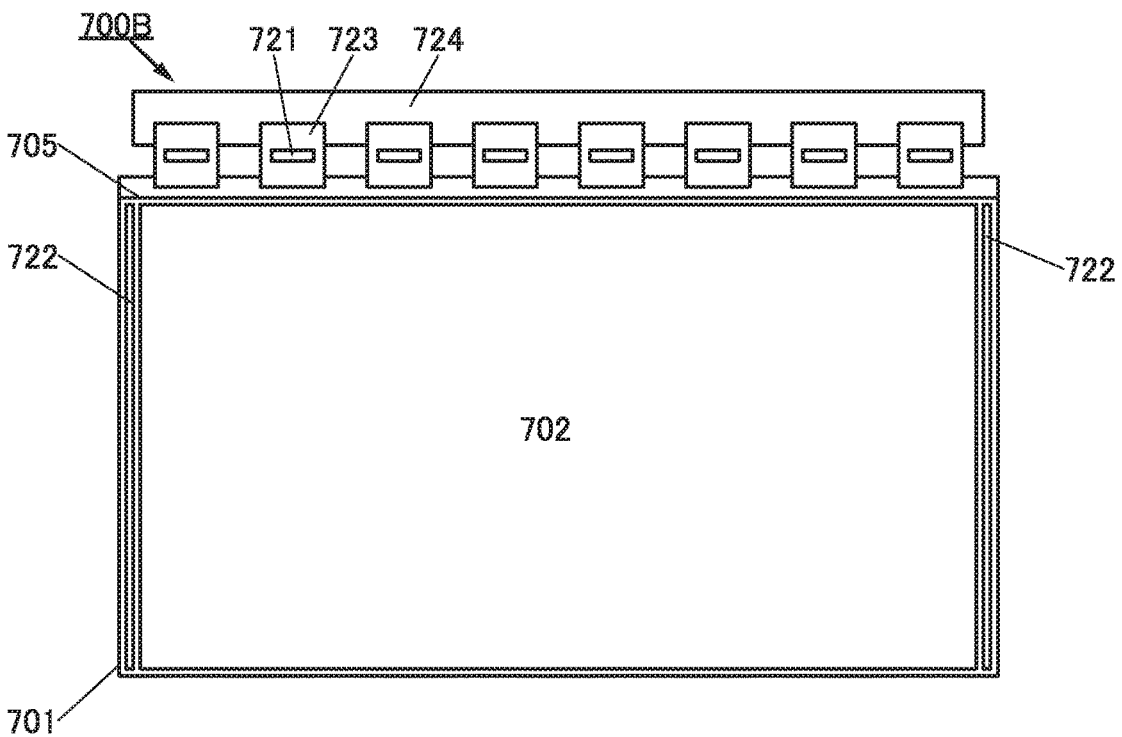

A display device 700B illustrated in FIG. 9C is a display device that can be suitably used for an electronic device with a large screen. For example, the display device 700B can be suitably used for a television device, a monitor device, a personal computer (including a laptop personal computer and a desktop personal computer), a tablet terminal, digital signage, and the like.

The display device 700B includes a plurality of source driver ICs 721 and a pair of gate drivers 722.

The plurality of source driver ICs 721 are attached to respective FPCs 723. One terminal of each of the plurality of FPCs 723 is connected to the first substrate 701 and the other terminal is connected to a printed circuit board 724. When the FPCs 723 are bent, the display device 700B can be mounted on an electronic device with the printed circuit board 724 placed on the rear side of the pixel portion 702, so that the space of the electronic device can be saved.

On the other hand, the gate drivers 722 are provided over the first substrate 701. Thus, an electronic device with a narrow frame can be obtained.

With such a structure, a large-size and high-resolution display device can be obtained. For example, such a structure can also be used for a display device whose screen diagonal is 30 inches or more, 40 inches or more, 50 inches or more, or 60 inches or more. Furthermore, a display device with extremely high resolution such as 4K2K or 8K4K can be obtained.

[Cross-Sectional Structure of Display Device]

Figure 10:
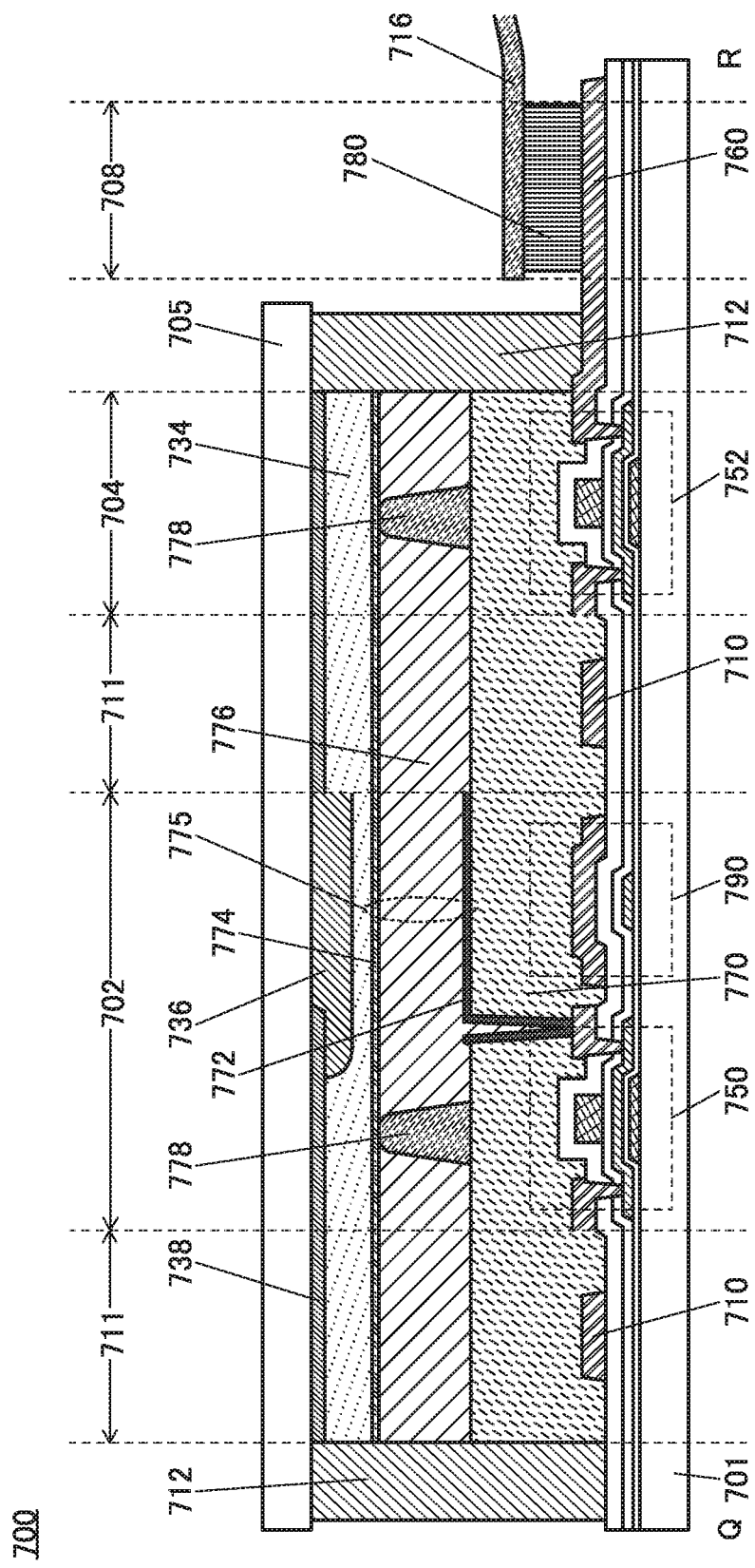
FIG. 10 is a cross-sectional view illustrating an example of a display device.
Figure 11:
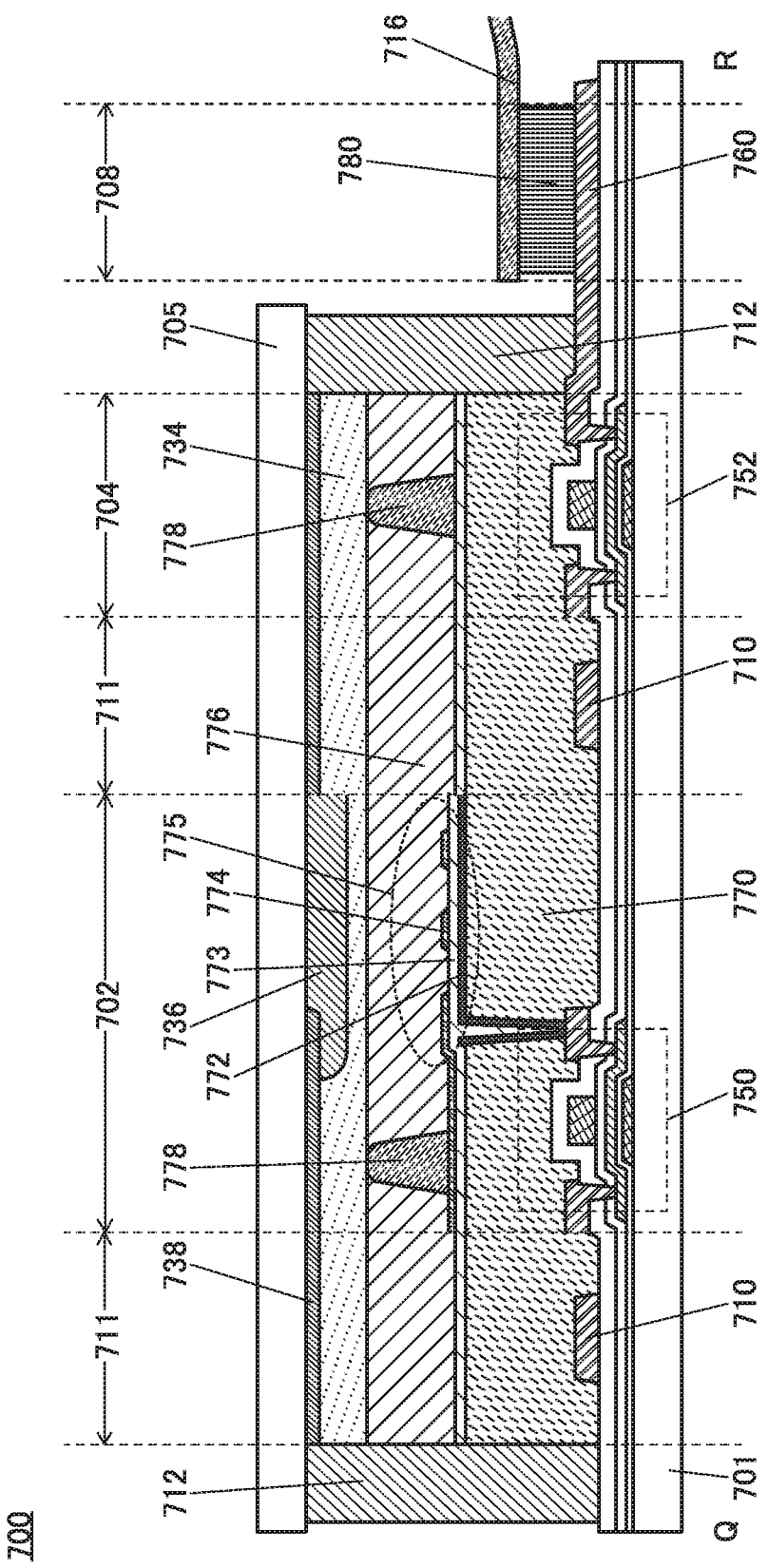
FIG. 11 is a cross-sectional view illustrating an example of a display device.
Figure 12:
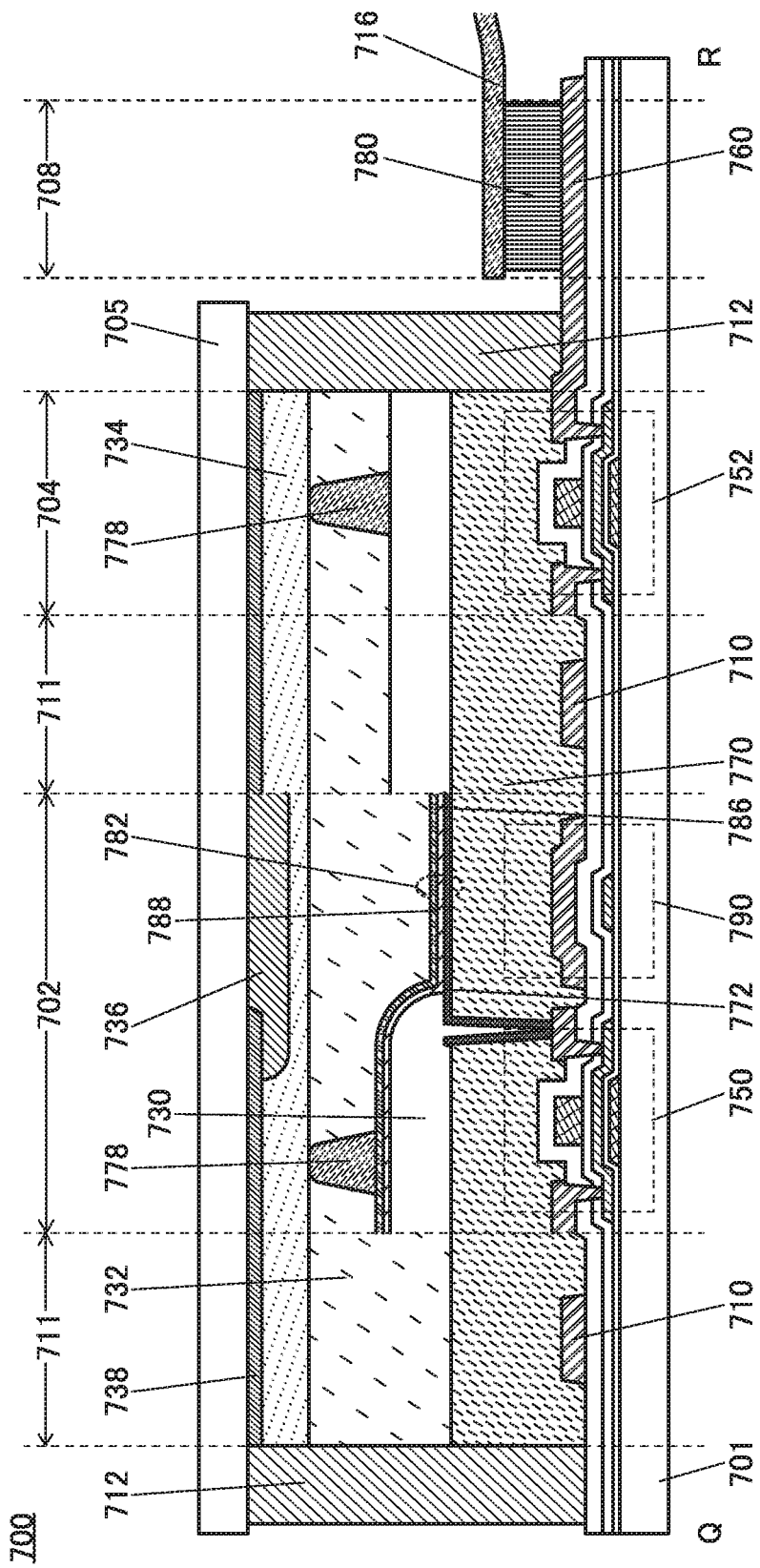
FIG. 12 is a cross-sectional view illustrating an example of a display device.
Figure 13:
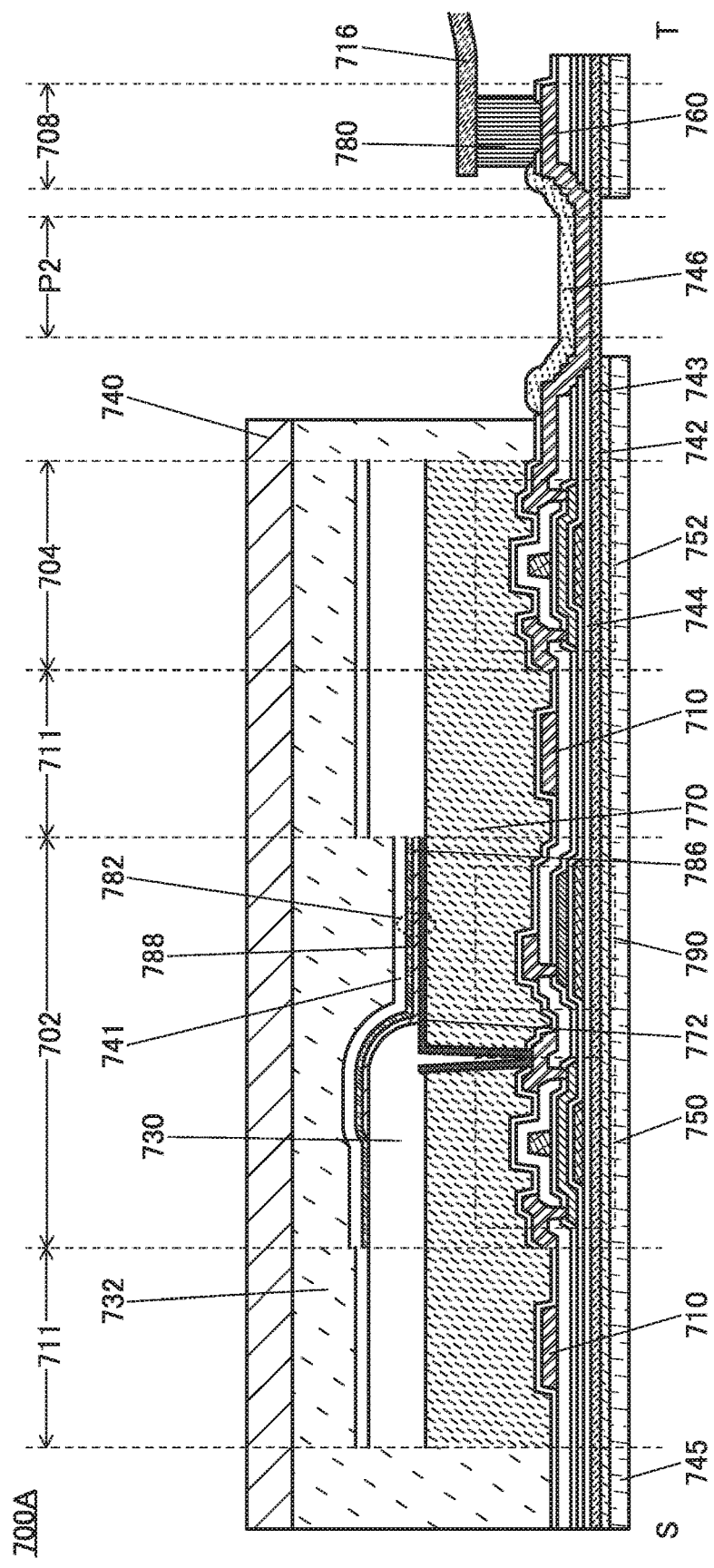
FIG. 13 is a cross-sectional view illustrating an example of a display device.

FIG. 10 and FIG. 11 illustrate display devices including liquid crystal elements as display elements. FIG. 12 and FIG. 13 illustrate display devices including EL elements as display elements. FIG. 10, FIG. 11, and FIG. 12 are each a cross-sectional view taken along a dashed-dotted line Q-R in FIG. 9A. FIG. 13 is a cross-sectional view taken along a dashed-dotted line S-T in FIG. 9B.

The display device 700 shown in FIG. 10 to FIG. 12 and the display device 700A shown in FIG. 13 include a lead wiring portion 711, the pixel portion 702, the source driver 704, and the FPC terminal portion 708. The lead wiring portion 711 includes the signal line 710. The pixel portion 702 includes a transistor 750 and a capacitor 790. FIG. 11 illustrates the case where the capacitor 790 is not provided. The source driver 704 includes a transistor 752.

The transistor 750 and the transistor 752 are each a transistor using an oxide semiconductor for a semiconductor layer in which a channel is formed. For example, any of the transistors described in Embodiment 1 can be used. The display device may include a transistor using silicon (amorphous silicon, polycrystalline silicon, or single crystal silicon) in a semiconductor layer.

The transistor used in this embodiment includes a highly purified oxide semiconductor film in which formation of oxygen vacancies is suppressed. The transistor can have a low off-state current. Accordingly, an electrical signal such as an image signal can be held for a longer period of time, and the interval between writing operations for image signals or the like can be set longer. Accordingly, the frequency of refresh operations can be reduced, resulting in an effect of reducing power consumption.

The transistor used in this embodiment can have relatively high field-effect mobility and thus is capable of high-speed operation. For example, with the use of such a transistor capable of high-speed operation for a display device, a switching transistor in a pixel portion and a driver transistor used in a driver circuit portion can be formed over one substrate. That is, a semiconductor device formed with a silicon wafer or the like does not need to be used separately as the driver circuit, which enables a reduction in the number of components of the display device. Moreover, the use of the transistor capable of high-speed operation in the pixel portion can provide a high-quality image.

The capacitor 790 illustrated in FIG. 10 and FIG. 12 includes a lower electrode formed in such a manner that the film which is the same as that for the semiconductor layer of the transistor 750 is processed and the resistance is reduced, and an upper electrode formed by processing the conductive film which is the same as that for a source electrode and a drain electrode. Furthermore, two insulating films covering the transistor 750 are provided between the lower electrode and the upper electrode. That is, the capacitor 790 has a stacked-layer structure in which the insulating films functioning as dielectric films are interposed between a pair of electrodes.

The capacitor 790 illustrated in FIG. 13 includes a lower electrode formed by processing the film which is the same as that for a first gate electrode of the transistor 750 and an upper electrode formed by processing the metal oxide film which is the same as that for the semiconductor layer. The upper electrode has reduced resistance in a manner similar to that of a low-resistance region of the transistor 750. Part of an insulating film functioning as a first gate insulating layer of the transistor 750 is provided between the lower electrode and the upper electrode. That is, the capacitor 790 has a stacked-layer structure in which the insulating films functioning as dielectric films are interposed between a pair of electrodes. A wiring obtained by processing the film which is the same as that for the source electrode and the drain electrode of the transistor is connected to the upper electrode.

A planarization insulating film 770 is provided over the transistor 750, the transistor 752, and the capacitor 790.

The transistor 750 included in the pixel portion 702 and the transistor 752 included in the source driver 704 may have different structures. For example, a top-gate transistor may be used as one of the transistors and a bottom-gate transistor may be used as the other. Note that the above-described gate driver 706 is also similar to the source driver 704.

The signal line 710 is formed using the conductive film which is the same as that for the source electrodes and the drain electrodes of the transistors 750 and 752, and the like. Here, a low-resistance material such as a material containing a copper element is preferably used, in which case signal delay or the like due to the wiring resistance or the like can be reduced and display on a large screen is possible.

The FPC terminal portion 708 includes a wiring 760 partly serving as a connection electrode, an anisotropic conductive film 780, and the FPC 716. The wiring 760 is electrically connected to a terminal included in the FPC 716 through the anisotropic conductive film 780. Here, the wiring 760 is formed using the conductive film which is the same as that for the source electrodes and the drain electrodes of the transistors 750 and 752, and the like.

As the first substrate 701 and the second substrate 705, a glass substrate or a flexible substrate such as a plastic substrate can be used, for example. The use of a flexible substrate enables providing a flexible display. In the case where a flexible substrate is used as the first substrate 701, an insulating layer having a barrier property against water or hydrogen is preferably provided between the first substrate 701 and the transistor 750 and the like.

On the second substrate 705 side, a light-blocking film 738, a coloring film 736, and an insulating film 734 that is in contact with these films are provided.

In FIG. 10, FIG. 11, and FIG. 12, between the first substrate 701 and the second substrate 705, a spacer 778 is provided for adjusting the space between the two substrates. The first substrate 701 and the second substrate 705 are bonded to each other with the sealant 712.

The display device 700 illustrated in FIG. 10 includes a liquid crystal element 775 in a vertical electric field mode. The liquid crystal element 775 includes a conductive layer 772, a conductive layer 774, and a liquid crystal layer 776 provided therebetween. The conductive layer 774 is provided on the second substrate 705 side and functions as a common electrode. The conductive layer 772 is electrically connected to the source electrode or the drain electrode included in the transistor 750. The conductive layer 772 is formed over the planarization insulating film 770 and functions as a pixel electrode.

For the conductive layer 772, a material having a visible-light-transmitting property or a material having a visible-light-reflective property can be used. An oxide material containing indium, zinc, tin, or the like is preferably used as the material having a visible-light-transmitting property, for example. A material containing aluminum, silver, or the like is preferably used as the material having a visible-light-reflective property, for example.

When a material having a visible-light-reflective property is used for the conductive layer 772, the display device 700 is a reflective liquid crystal display device. On the other hand, when a material having a visible-light-transmitting property is used for the conductive layer 772, the display device 700 is a transmissive liquid crystal display device. In the case of a reflective liquid crystal display device, a polarizing plate is provided on the viewer side. On the other hand, in the case of a transmissive liquid crystal display device, a pair of polarizing plates are provided such that the liquid crystal element is sandwiched therebetween.

The display device 700 illustrated in FIG. 11 is an example in which the liquid crystal element 775 in a horizontal electric field mode (e.g., a fringe field switching (FFS) mode) is used. The conductive layer 774 functioning as a common electrode is provided over the conductive layer 772 with an insulating layer 773 interposed therebetween. The alignment state of the liquid crystal layer 776 can be controlled by the electric field generated between the conductive layer 772 and the conductive layer 774.

In FIG. 11, a storage capacitor can be formed by the stacked-layer structure of the conductive layer 772, the insulating layer 773, and the conductive layer 774. Therefore, it is not necessary to provide a capacitor separately, and thus the aperture ratio can be increased.

Although not illustrated in FIG. 10 and FIG. 11, an alignment film in contact with the liquid crystal layer 776 may be provided. An optical member (an optical substrate) such as a polarizing member, a retardation member, or an anti-reflection member and a light source such as a backlight or a side light can be provided as appropriate.

As the liquid crystal layer 776, thermotropic liquid crystal, low-molecular liquid crystal, high-molecular liquid crystal, polymer dispersed liquid crystal, polymer network liquid crystal, ferroelectric liquid crystal, anti-ferroelectric liquid crystal, or the like can be used. In the case of employing a horizontal electric field mode, liquid crystal exhibiting a blue phase for which an alignment film is not used may be used.

As the mode of the liquid crystal element, a twisted nematic (TN) mode, a vertical alignment (VA) mode, an in-plane-switching (IPS) mode, an FFS mode, an axially symmetric aligned micro-cell (ASM) mode, an optically compensated birefringence (OCB) mode, an electrically controlled birefringence (ECB) mode, a VA-IPS mode, a guest-host mode, or the like can be employed.

As a driving method of the liquid crystal element, a time-division display method (also referred to as a field-sequential driving method) by which color display is performed by a successive additive color mixing method may be used. In that case, a structure without the coloring film 736 can be employed. In the case of using a time-division display method, it is not necessary to provide subpixels that exhibit red (R), green (G), and blue (B), which enables an increase in the aperture ratio of the pixel and the resolution of the display device.

The display device 700 illustrated in FIG. 12 and the display device 700A illustrated in FIG. 13 include a light-emitting element 782. The light-emitting element 782 includes the conductive layer 772, an EL layer 786, and a conductive film 788. The EL layer 786 includes a light-emitting substance.

As the light-emitting substance, a substance emitting fluorescence (a fluorescent material), a substance emitting phosphorescence (a phosphorescent material), a substance exhibiting thermally activated delayed fluorescence (a thermally activated delayed fluorescent (TADF) material), an inorganic compound (e.g., a quantum dot material), or the like can be used.

In the display device 700 illustrated in FIG. 12 and the display device 700A illustrated in FIG. 13, an insulating film 730 covering part of the conductive layer 772 is provided over the planarization insulating film 770. Here, the light-emitting element 782 is a top-emission light-emitting element including the conductive film 788, which transmits visible light. Note that the light-emitting element 782 may have a bottom-emission structure in which light is emitted to the conductive layer 772 side or a dual-emission structure in which light is emitted to both the conductive layer 772 side and the conductive film 788 side.

In FIG. 12, the coloring film 736 is provided in a position overlapping with the light-emitting element 782, and the light-blocking film 738 is provided in a position overlapping with the insulating film 730, in the lead wiring portion 711, and in the source driver 704. The coloring film 736 and the light-blocking film 738 are covered with the insulating film 734. A space between the light-emitting element 782 and the insulating film 734 is filled with a sealing film 732. Note that it is not necessary to provide the coloring film 736 in the case of using a side-by-side method (also referred to as a separate coloring method) in which subpixels of the respective colors are provided with the respective EL layers 786, as illustrated in FIG. 13.

In FIG. 13, the EL layer 786 of the light-emitting element 782 is provided to have an island shape over the insulating film 730 and the conductive layer 772. The EL layer 786 is formed separately such that the subpixels have the respective emission colors, whereby color display can be achieved without the coloring film 736. A protective layer 741 is provided to cover the light-emitting element 782. The protective layer 741 has a function of preventing diffusion of an impurity such as water to the light-emitting element 782. The protective layer 741 is preferably formed using an inorganic insulating film. It is further preferable to employ a stacked-layer structure including one or more inorganic insulating films and one or more organic insulating films.

The display device 700A illustrated in FIG. 13 has, instead of the first substrate 701 illustrated in FIG. 12, a structure in which a support substrate 745, an adhesive layer 742, the resin layer 743, and an insulating layer 744 are stacked. The transistor 750, the capacitor 790, and the like are provided over the insulating layer 744.

The support substrate 745 contains an organic resin, glass, or the like and is thin enough to have flexibility. The resin layer 743 contains an organic resin such as a polyimide or acrylic. The insulating layer 744 includes an inorganic insulating film of silicon oxide, silicon oxynitride, silicon nitride, or the like. The resin layer 743 and the support substrate 745 are bonded to each other with the adhesive layer 742. The resin layer 743 is preferably thinner than the support substrate 745.

The display device 700A illustrated in FIG. 13 includes a protective layer 740 instead of the second substrate 705 illustrated in FIG. 12. The protective layer 740 is bonded to the sealing film 732. A glass substrate, a resin film, or the like can be used as the protective layer 740. As the protective layer 740, an optical member such as a polarizing plate or a diffusion plate, an input device such as a touch sensor, or a structure in which two of any of these are stacked may be used.

FIG. 13 illustrates the region P2 that is bendable. In the region P2, there is a portion where an inorganic insulating film such as the insulating layer 744 as well as the support substrate 745 and the adhesive layer 742 are not provided. In the region P2, a resin layer 746 is provided to cover the wiring 760. When the bendable region P2 is provided with a minimum of an inorganic insulating film and has a structure in which only a conductive layer containing a metal or an alloy and a layer containing an organic material are stacked, a crack can be prevented from being caused at the time of folding. When the support substrate 745 is not provided in the region P2, part of the display device 700A can be folded with an extremely small radius of curvature.

The display device in this embodiment may include an input device such as a touch sensor. That is, the display device in this embodiment may have a function of a touch panel.

A variety of types such as a capacitive type, a resistive type, a surface acoustic wave type, an infrared type, an optical type, and a pressure-sensitive type can be used for the sensor. Alternatively, a combination of two or more of these types may be employed.

Examples of a touch panel include what is called an in-cell touch panel in which an input device is formed inside a pair of substrates; what is called an on-cell touch panel in which an input device is formed over a display device; and what is called an out-cell touch panel that is bonded to a display device to be used.

This embodiment can be combined with the other embodiments as appropriate.

Embodiment 3

In this embodiment, a display device that includes the semiconductor device of one embodiment of the present invention will be described with reference to FIGS. 14A to 14C.

Since the semiconductor device of one embodiment of the present invention has favorable electrical characteristics, a display device can have increased reliability by using the semiconductor device. For example, the transistor of one embodiment of the present invention can be applied to transistors included in one or both of a pixel and a driver circuit of the display device.

Figure 14A:
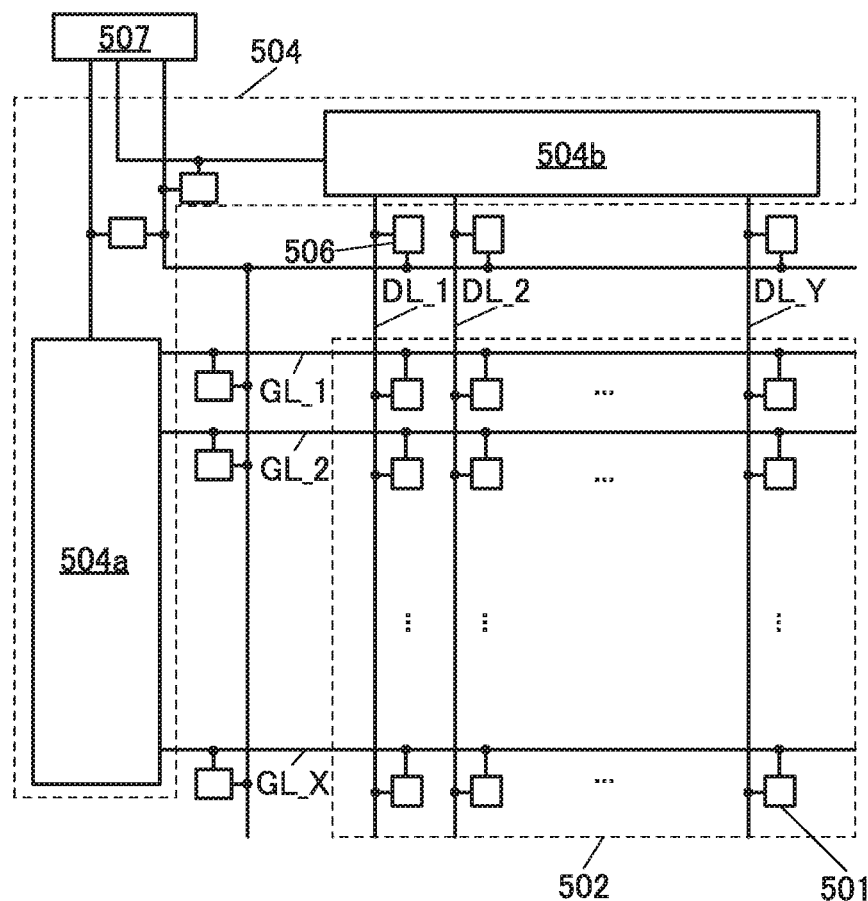
FIG. 14A is a block diagram illustrating an example of a display device and FIGS. 14B and 14C are circuit diagrams illustrating the example of the display device.

The display device in FIG. 14A includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502 and the driver circuit portion 504. The protection circuits 506 may also use the transistor of one embodiment of the present invention.

The pixel portion 502 includes a plurality of pixel circuits 501 that drive a plurality of display elements that are arranged in X rows and Y columns (X and Y each independently represent a natural number of 2 or more).

The driver circuit portion 504 includes driver circuits such as a gate driver 504a that outputs a scanning signal to scanning lines GL_1 to GL_X and a source driver 504b that supplies a data signal to data lines DL_1 to DL_Y. The gate driver 504a includes at least a shift register. The source driver 504b is formed using a plurality of analog switches, for example. In addition, the source driver 504b may be formed using a shift register or the like.

The terminal portion 507 refers to a portion provided with terminals for inputting power, control signals, image signals, and the like to the display device from external circuits.

The protection circuit 506 is a circuit that makes, when a potential out of a certain range is applied to the wiring connected to the protection circuit, the wiring and another wiring be in conduction state. The protection circuit 506 illustrated in FIG. 14A is connected to various kinds of wirings such as scanning lines GL, which are wirings between the gate driver 504a and the pixel circuits 501, and the data lines DL, which are wirings between the source driver 504b and the pixel circuits 501.

The gate driver 504a and the source driver 504b may each be directly formed over the same substrate as the pixel portion 502 or may each be formed over another substrate to be mounted on a substrate where a pixel portion is formed by COG or tape automated bonding (TAB).

Figures 14B, 14C:
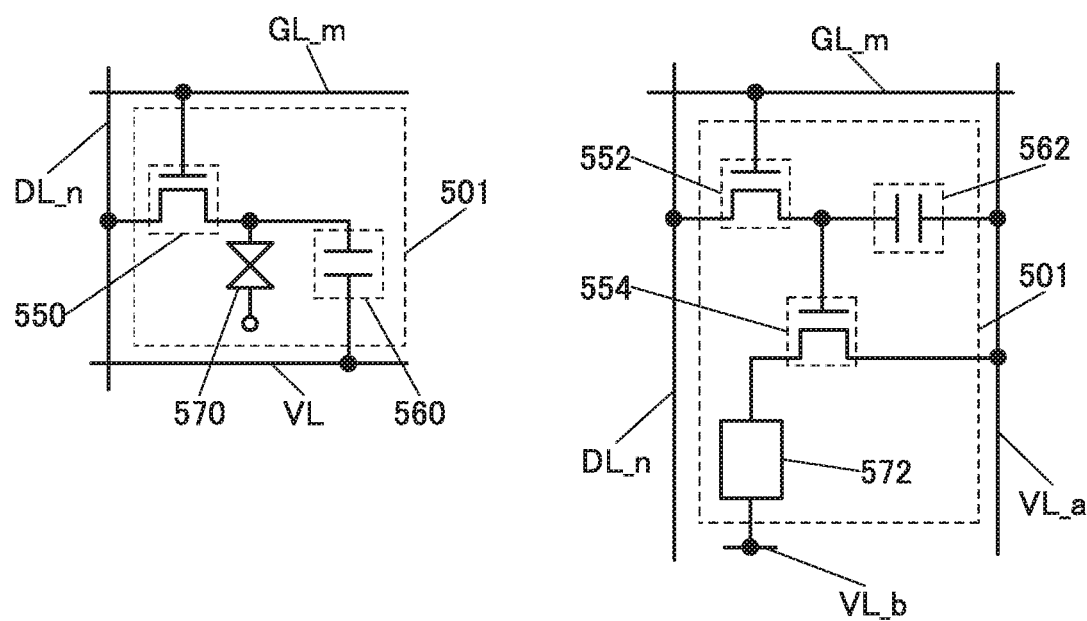

The plurality of pixel circuits 501 illustrated in FIG. 14A can have any of the configurations illustrated in FIG. 14B and FIG. 14C, for example.

The pixel circuit 501 illustrated in FIG. 14B includes a liquid crystal element 570, a transistor 550, and a capacitor 560. The data line DL_n, the scanning line GL_m, a potential supply line VL, and the like are connected to the pixel circuit 501.

The potential of one of a pair of electrodes of the liquid crystal element 570 is set in accordance with the specifications of the pixel circuit 501 as appropriate. The alignment state of the liquid crystal element 570 is set depending on written data. Note that a common potential may be supplied to one of the pair of electrodes of the liquid crystal element 570 included in each of the plurality of pixel circuits 501. Moreover, a different potential may be supplied to one of the pair of electrodes of the liquid crystal element 570 of the pixel circuit 501 in each row.

The pixel circuit 501 illustrated in FIG. 14C includes transistors 552 and 554, a capacitor 562, and a light-emitting element 572. The data line DL_n, the scanning line GL_m, a potential supply line VL_a, a potential supply line VL_b, and the like are connected to the pixel circuit 501.

A high power supply potential VDD is supplied to one of the potential supply line VL_a and the potential supply line VL_b, and a low power supply potential VSS is supplied to the other. Current flowing in the light-emitting element 572 is controlled in accordance with the potential applied to a gate of the transistor 554, whereby the luminance of light emitted from the light-emitting element 572 is controlled.

This embodiment can be combined with the other embodiments as appropriate.

Embodiment 4

In this embodiment, a display device that includes the semiconductor device of one embodiment of the present invention will be described with reference to FIGS. 15A to 15D.

A pixel of the display device in this embodiment includes a memory for correcting a gradation level (luminance value). The transistor of one embodiment of the present invention can be used as the transistor included in the pixel.

[Pixel Circuit]

Figure 15A:
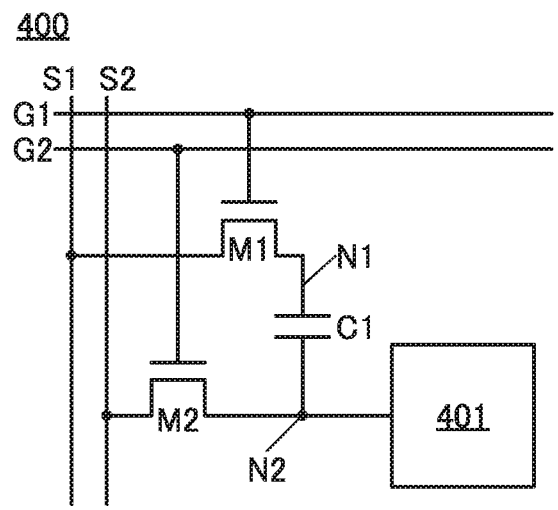
FIGS. 15A, 15C, and 15D are circuit diagrams illustrating examples of a display device

FIG. 15A shows a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other of the source and the drain is connected to one electrode of the capacitor C1. In the transistor M2, a gate is connected to the wiring G2, one of a source and a drain is connected to the wiring S2, and the other of the source and the drain is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS element, or the like can be used.

A node connecting the transistor M1 and the capacitor C1 is N1, and a node connecting the transistor M2 and the circuit 401 is N2.

In the pixel circuit 400, the potential of the node N1 can be retained when the transistor M1 is turned off. The potential of the node N2 can be retained when the transistor M2 is turned off. When a predetermined potential is written in the node N1 through the transistor M1 with the transistor M2 being in an off state, the potential of the node N2 can be changed in accordance with a change in the potential of the node N1 owing to capacitive coupling through the capacitor C1.

Here, the transistor using an oxide semiconductor, which is described in Embodiment 1 as an example, can be used as one or both of the transistor M1 and the transistor M2. In that case, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

[Driving Method]

Figure 15B:
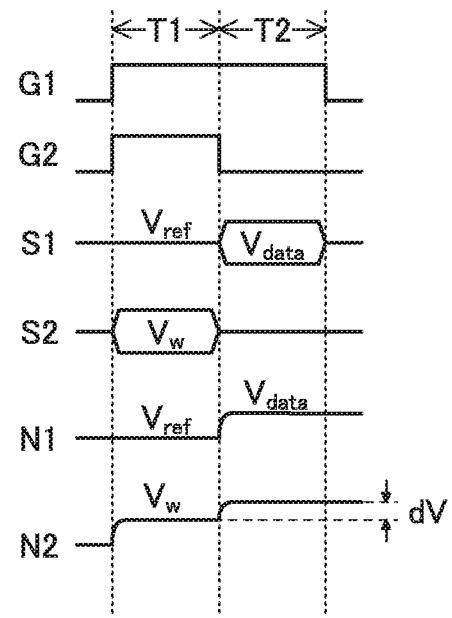
FIG. 15B is a timing chart for the display device.

An example of an operation method of the pixel circuit 400 is described with reference to FIG. 15B. FIG. 15B is a timing chart according to the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 15B, one frame period is divided into a period T1 and a period T2. The period T1 is a period in which a potential is written in the node N2, and the period T2 is a period in which a potential is written in the node N1.

In the period T1, a potential for turning on the transistor is supplied to both the wiring G1 and the wiring G2. In addition, a potential $V_{ref}$ that is a fixed potential is supplied to the wiring S1 and a first data potential $V_w$ is supplied to the wiring S2.

The potential $V_{ref}$ is supplied from the wiring S1 to the node N1 through the transistor M1. The first data potential $V_w$ is supplied to the node N2 through the transistor M2. Accordingly, a potential difference $V_w$-$V_{ref}$ is retained in the capacitor C1.

In the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 is supplied with a predetermined potential or is set in a floating state.

The second data potential $V_{data}$ is supplied to the node N1 through the transistor M1. At this time, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although the potential dV is shown as having a positive value in FIG. 15B, the potential dV may have a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently higher than the capacitance of the circuit 401, the potential dV is a potential close to the second data potential $V_{data}$.

In the pixel circuit 400, a potential to be supplied to the circuit 401 including the display element can be generated by combination of two kinds of data signals as described above, whereby correction of a gradation level can be performed in the pixel circuit 400.

In the pixel circuit 400, it is also possible to generate a potential exceeding the maximum potential that can be supplied to the wiring S1 and the wiring S2. For example, in the case of using a light-emitting element, high-dynamic range (HDR) display or the like can be performed. In the case of using a liquid crystal element, overdriving or the like can be achieved.

[Pixel Circuit Including Liquid Crystal Element]

Figure 15C:
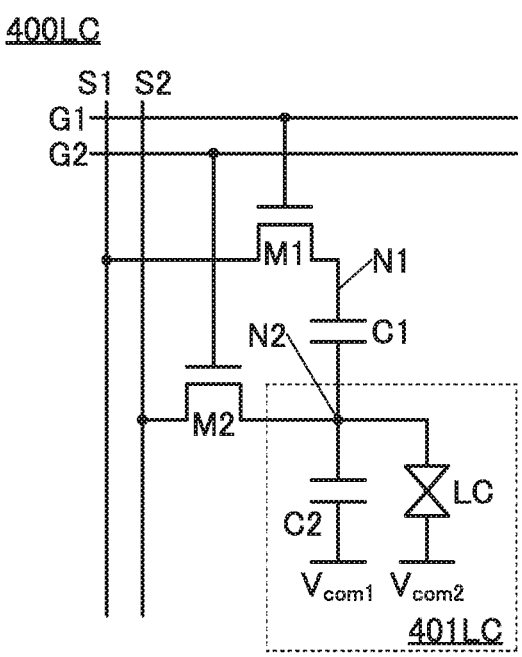

A pixel circuit 400LC shown in FIG. 15C includes a circuit 401LC. The circuit 401LC includes a liquid crystal element LC and a capacitor C2.

One electrode of the liquid crystal element LC is connected to the node N2 and one electrode of the capacitor C2, and the other electrode of the liquid crystal element LC is connected to a wiring supplied with a potential $V_{com2}$. The other electrode of the capacitor C2 is connected to a wiring supplied with a potential $V_{com1}$.

The capacitor C2 serves as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high drive voltage can be employed, for example. The gradation level can also be corrected in accordance with the operation temperature, the deterioration state of the liquid crystal element LC, or the like by supply of a correction signal to the wiring S1 or the wiring S2.

[Pixel Circuit Including Light-Emitting Element]

Figure 15D:
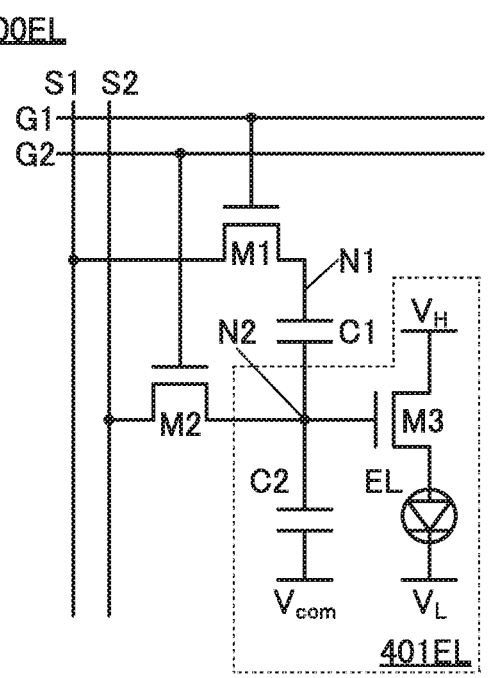

A pixel circuit 400EL shown in FIG. 15D includes a circuit 401EL. The circuit 401EL includes a light-emitting element EL, a transistor M3, and the capacitor C2.

In the transistor M3, a gate is connected to the node N2 and one electrode of the capacitor C2, one of a source and a drain is connected to a wiring supplied with a potential $V_H$, and the other of the source and the drain is connected to one electrode of the light-emitting element EL. The other electrode of the capacitor C2 is connected to a wiring supplied with a potential $V_{com}$. The other electrode of the light-emitting element EL is connected to a wiring supplied with a potential $V_L$.

The transistor M3 has a function of controlling current to be supplied to the light-emitting element EL. The capacitor C2 serves as a storage capacitor. The capacitor C2 can be omitted when not needed.

Note that although the structure is described here in which the anode side of the light-emitting element EL is connected to the transistor M3, the transistor M3 may be connected to the cathode side. In that case, the values of the potential $V_H$ and the potential $V_L$ can be appropriately changed.

In the pixel circuit 400EL, a large amount of current can flow in the light-emitting element EL when a high potential is applied to the gate of the transistor M3, which enables HDR display or the like. A variation in the electrical characteristics of the transistor M3 and the light-emitting element EL can also be corrected by supply of a correction signal to the wiring S1 or the wiring S2.

Note that the configuration is not limited to the circuits shown in FIG. 15C and FIG. 15D as examples, and the configuration to which a transistor, a capacitor, or the like is further added may be employed.

This embodiment can be combined with the other embodiments as appropriate.

Embodiment 5

In this embodiment, a display module of one embodiment of the present invention will be described with reference to FIGS. 16A and 16B.

Figure 16A:
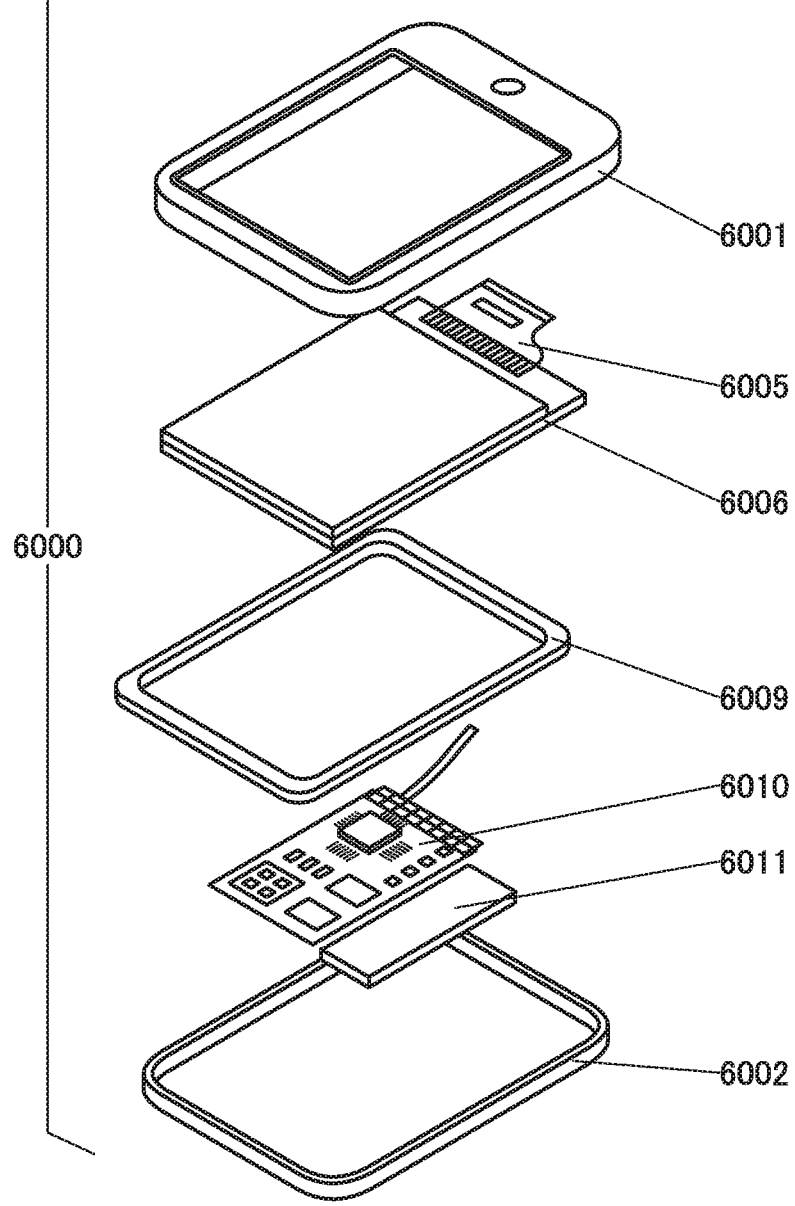
FIGS. 16A and 16B illustrate an example of a display module.

In a display module 6000 illustrated in FIG. 16A, a display device 6006 to which an FPC 6005 is connected, a frame 6009, a printed circuit board 6010, and a battery 6011 are provided between an upper cover 6001 and a lower cover 6002.

The display device manufactured using the transistor of one embodiment of the present invention can be used for the display device 6006. With the display device 6006, a highly reliable display module can be provided.

The shape and size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like. Power supply using the battery 6011 may be employed.

Figure 16B:
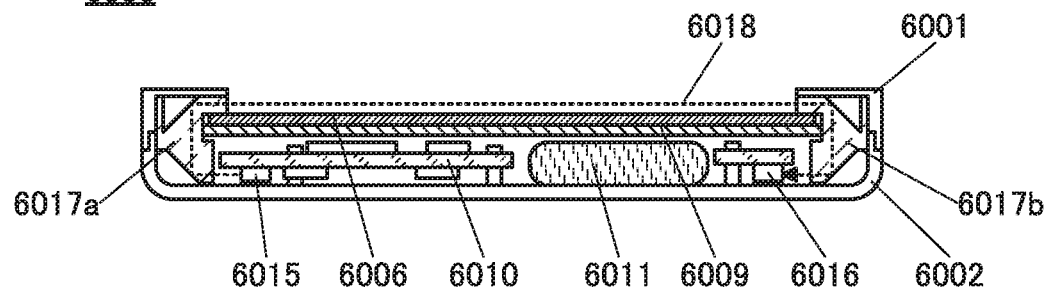

FIG. 16B is a schematic cross-sectional view of the display module 6000 with an optical touch sensor.

The display module 6000 includes a light-emitting portion 6015 and a light-receiving portion 6016 which are provided on the printed circuit board 6010. Furthermore, a pair of light guide portions (a light guide portion 6017a and a light guide portion 6017b) are provided in a region surrounded by the upper cover 6001 and the lower cover 6002.

The display device 6006 overlaps with the printed circuit board 6010 and the battery 6011 with the frame 6009 located therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus enables detection of touch operation.

A plurality of the light-emitting portions 6015 are provided along two adjacent sides of the display device 6006, for example. A plurality of the light-receiving portions 6016 are provided so as to face the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electrical signal can be used. A photodiode that can receive infrared rays can be favorably used.

With the use of the light guide portion 6017a and the light guide portion 6017b which transmit the light 6018, the light-emitting portion 6015 and the light-receiving portion 6016 can be placed under the display device 6006, and a malfunction of the touch sensor due to external light reaching the light-receiving portion 6016 can be suppressed. Particularly when a resin which absorbs visible light and transmits infrared rays is used, a malfunction of the touch sensor can be more effectively inhibited.

This embodiment can be combined with the other embodiments as appropriate.

Embodiment 6

In this embodiment, electronic devices of embodiments of the present invention will be described with reference to FIGS. 17A and 17B, FIGS. 18A to 18D, FIGS. 19A to 19E, and FIGS. 20A to 20F.

Electronic devices in this embodiment are each provided with the semiconductor device of one embodiment of the present invention. For example, the transistor of one embodiment of the present invention can be used as a transistor of a display device used in a display portion of the electronic device. Since the transistor of one embodiment of the present invention has stable and favorable electrical characteristics and high reliability, the display device and the electronic device can have increased reliability. Therefore, the transistor of one embodiment of the present invention can be used for a variety of electronic devices.

The display portion of the electronic device in this embodiment can display a video with a resolution of, for example, full high definition, 4K2K, 8K4K, 16K8K, or higher.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment can be incorporated along a curved surface of an inside wall or an outside wall of a house or a building or the interior or the exterior of a car.

The electronic device in this embodiment may include an antenna. When a signal is received by the antenna, the electronic device can display a video, data, or the like on the display portion. When the electronic device includes the antenna and a secondary battery, the antenna may be used for contactless power transmission.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 17A:
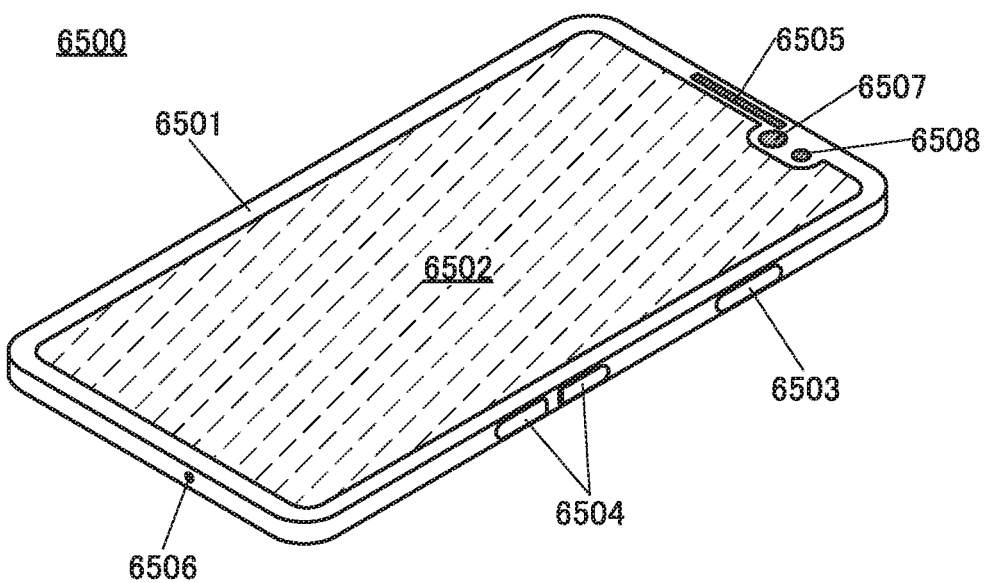
FIGS. 17A and 17B illustrate an example of an electronic device.

An electronic device 6500 illustrated in FIG. 17A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display portion 6502 can use a display device including the transistor of one embodiment of the present invention.

Figure 17B:
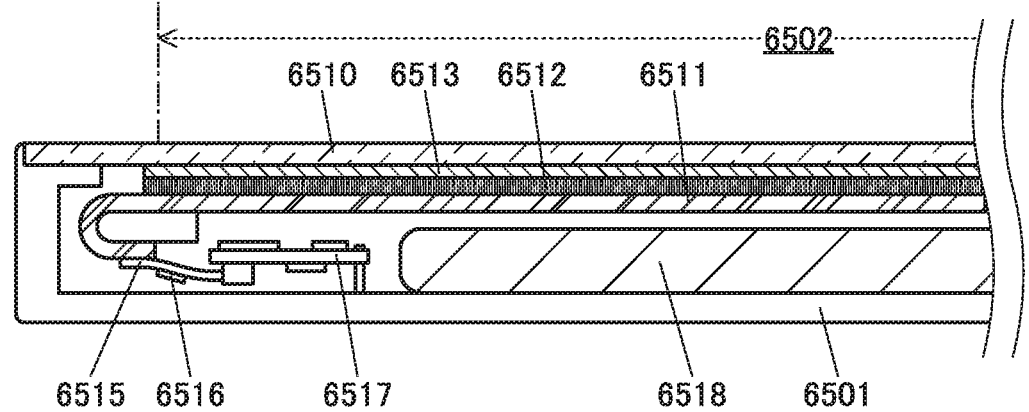

FIG. 17B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not shown).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Figure 18A:
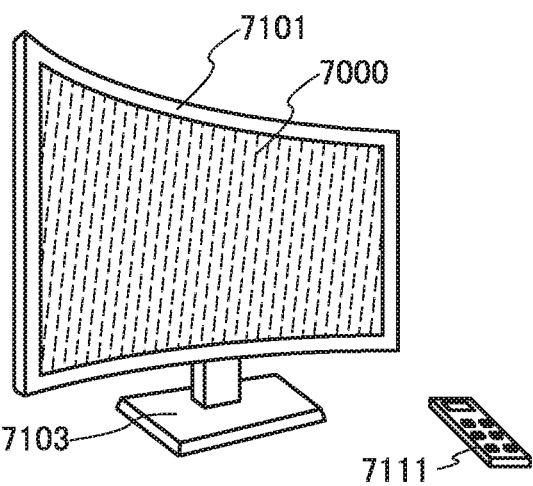
FIGS. 18A to 18D illustrate examples of electronic devices.

FIG. 18A illustrates an example of a television device. In a television device 7100, a display portion 7000 is incorporated in a housing 7101. Here, a structure in which the housing 7101 is supported by a stand 7103 is illustrated.

The display portion 7000 can use a display device including the transistor of one embodiment of the present invention.

Operation of the television device 7100 illustrated in FIG. 18A can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 18B:
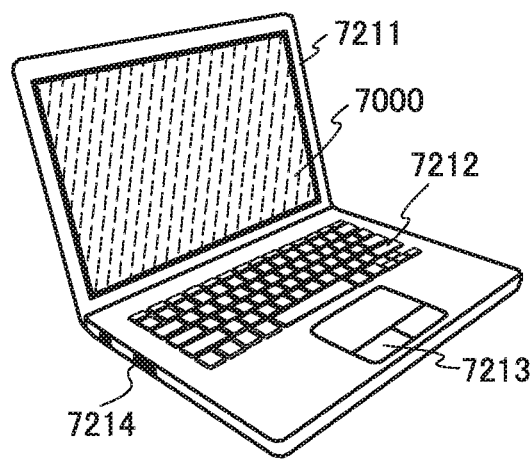

FIG. 18B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The display portion 7000 can use a display device including the transistor of one embodiment of the present invention.

Figure 18C:
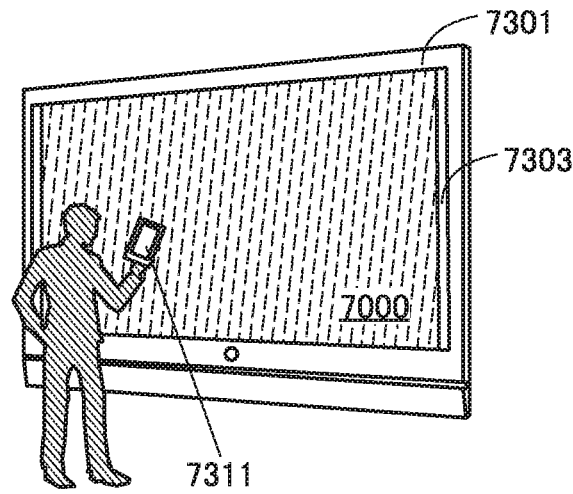
Figure 18D:
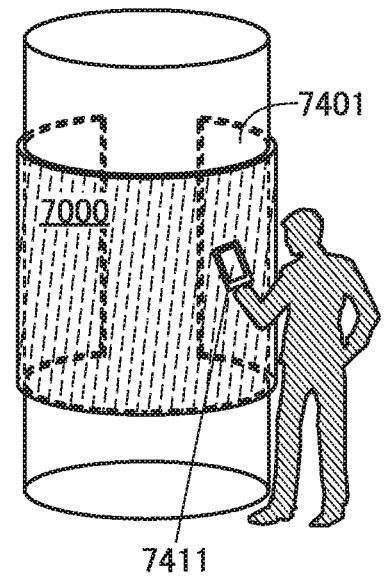

FIGS. 18C and 18D illustrate examples of digital signage.

Digital signage 7300 illustrated in FIG. 18C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 18D is digital signage 7400 attached to a cylindrical pillar 7401. The digital signage 7400 includes the display portion 7000 provided along a curved surface of the pillar 7401.

In FIGS. 18C and 18D, the display portion 7000 can use a display device including the transistor of one embodiment of the present invention.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIGS. 18C and 18D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Figure 19A:
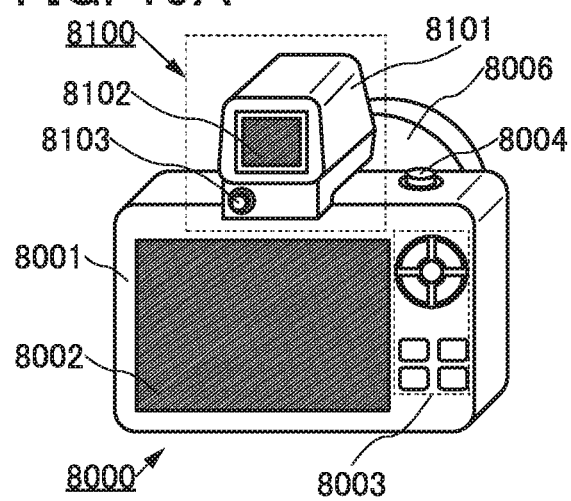
FIGS. 19A to 19E illustrate examples of electronic devices.

FIG. 19A is an external view of a camera 8000 to which a finder 8100 is attached.

The camera 8000 includes a housing 8001, a display portion 8002, operation buttons 8003, a shutter button 8004, and the like. A detachable lens 8006 is attached to the camera 8000. Note that the lens 8006 and the housing may be integrated with each other in the camera 8000.

The camera 8000 can take images by the press of the shutter button 8004 or touch on the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with a mount engaging with a mount of the camera 8000. The finder 8100 can display a video received from the camera 8000 and the like on the display portion 8102.

The button 8103 serves as a power button or the like.

The display portion 8002 of the camera 8000 and the display portion 8102 of the finder 8100 can use a display device including the transistor of one embodiment of the present invention. Note that a finder may be incorporated in the camera 8000.

Figure 19B:
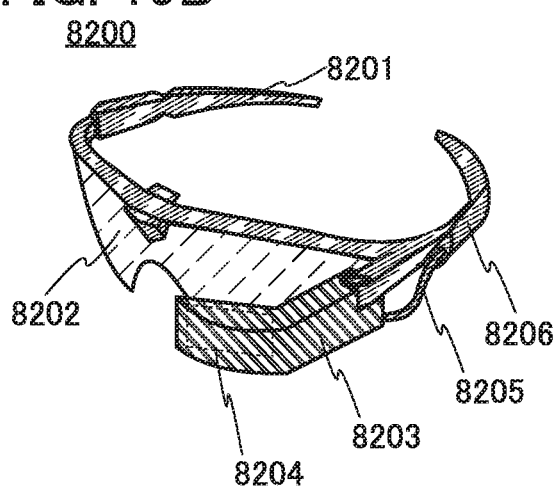

FIG. 19B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display received video information on the display portion 8204. The main body 8203 is provided with a camera, and data on the movement of the user's eyeball and eyelid can be used as an input means.

The mounting portion 8201 may include a plurality of electrodes capable of sensing current flowing in response to the movement of the user's eyeball in a position in contact with the user to achieve a function of recognizing the user's sight line. A function of monitoring the user's pulse with the use of current flowing through the electrodes may be achieved. The mounting portion 8201 may include various sensors such as a temperature sensor, a pressure sensor, and an acceleration sensor to have a function of displaying the user's biological information on the display portion 8204 or a function of changing a video displayed on the display portion 8204 in accordance with the movement of the user's head.

The display portion 8204 can use a display device including the transistor of one embodiment of the present invention.

Figure 19C:
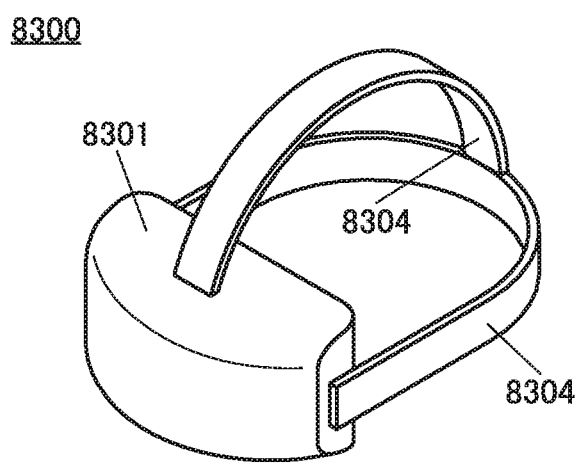
Figure 19D:
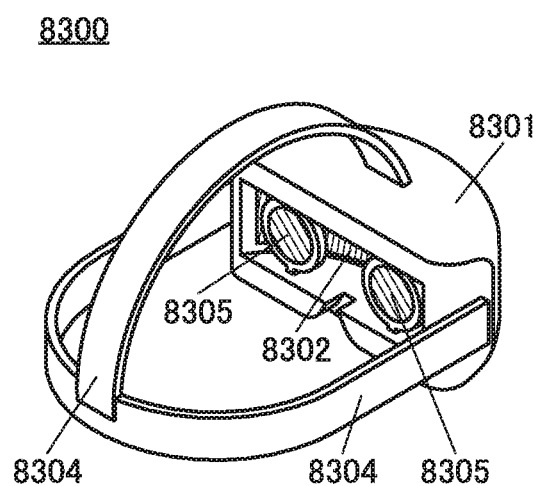
Figure 19E:
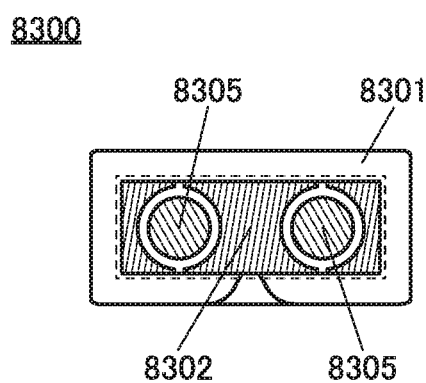

FIGS. 19C, 19D, and 19E are external views of a head-mounted display 8300. The head-mounted display 8300 includes a housing 8301, a display portion 8302, a band-shaped fixing unit 8304, and a pair of lenses 8305.

A user can see display on the display portion 8302 through the lenses 8305. Note that the display portion 8302 is preferably curved and placed, in which case the user can feel a high realistic sensation. When another image displayed in a different region of the display portion 8302 is viewed through the lenses 8305, three-dimensional display using parallax or the like can also be performed. Note that the configuration is not limited to that in which one display portion 8302 is provided, and two display portions 8302 may be provided so that one display portion is provided for one eye of the user.

The display portion 8302 can use a display device including the transistor of one embodiment of the present invention. With the use of the transistor of one embodiment of the present invention, a display device with extremely high resolution can also be manufactured. For example, a pixel is not easily seen by the user even when the user sees display that is magnified by the use of the lenses 8305 as illustrated in FIG. 19E. In other words, a video with a strong sense of reality can be seen by the user with the use of the display portion 8302.

Electronic devices shown in FIGS. 20A to 20F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices shown in FIGS. 20A to 20F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices shown in FIGS. 20A to 20F will be described below.

Figure 20A:
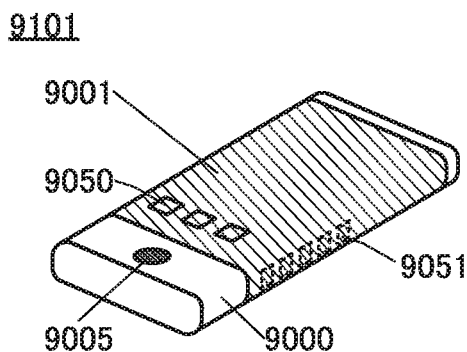
FIGS. 20A to 20F illustrate examples of electronic devices.

FIG. 20A is a perspective view showing a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 20A shows an example where three icons 9050 are displayed. Information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the reception strength of an antenna. Alternatively, the icon 9050 or the like may be displayed in the position where the information 9051 is displayed.

Figure 20B:
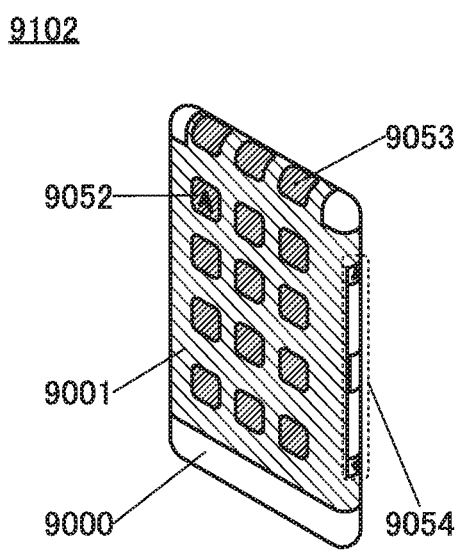

FIG. 20B is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 20C:
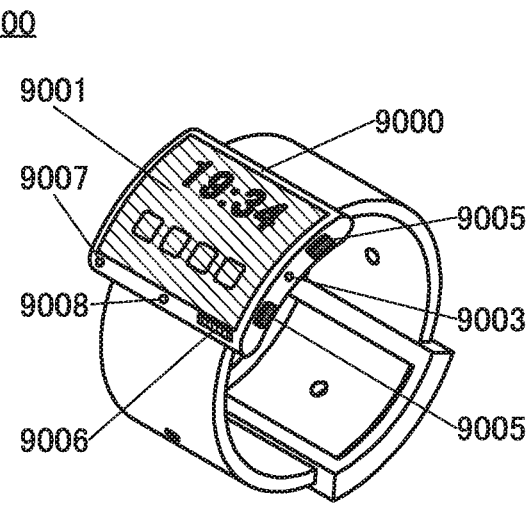

FIG. 20C is a perspective view showing a watch-type portable information terminal 9200. For example, the portable information terminal 9200 can be used as a smart watch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 20D:
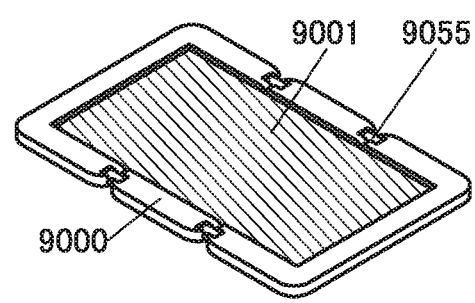
Figure 20E:
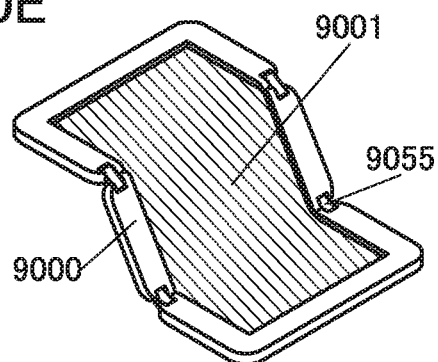
Figure 20F:
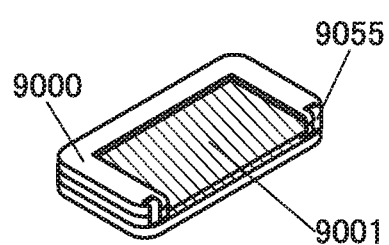

FIGS. 20D, 20E, and 20F are perspective views showing a foldable portable information terminal 9201. FIG. 20D is a perspective view of an opened state of the portable information terminal 9201, FIG. 20F is a perspective view of a folded state thereof, and FIG. 20E is a perspective view of a state in the middle of change from one of FIG. 20D and FIG. 20F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 0.1 mm and less than or equal to 150 mm.

This embodiment can be combined with the other embodiments and the example as appropriate.

Example 1

In this example will be described evaluation results of transistors manufactured using the manufacturing method of a transistor of one embodiment of the present invention. Here, two kinds of samples were manufactured.

As Sample A to which one embodiment of the present invention was applied, a stacked-layer structure corresponding to the structure of the transistor 100A illustrated in FIGS. 3A to 3C was formed. Specifically, the conductive layer 106, the insulating layer 103, the semiconductor layer 108, the gate insulating layer 110, the gate electrode 112, the insulating layer 118, the conductive layer 120a, and the conductive layer 120b were formed over the substrate 102. Furthermore, a planarization film (not shown) was formed over the insulating layer 118, the conductive layer 120a, and the conductive layer 120b.

Figure 21:
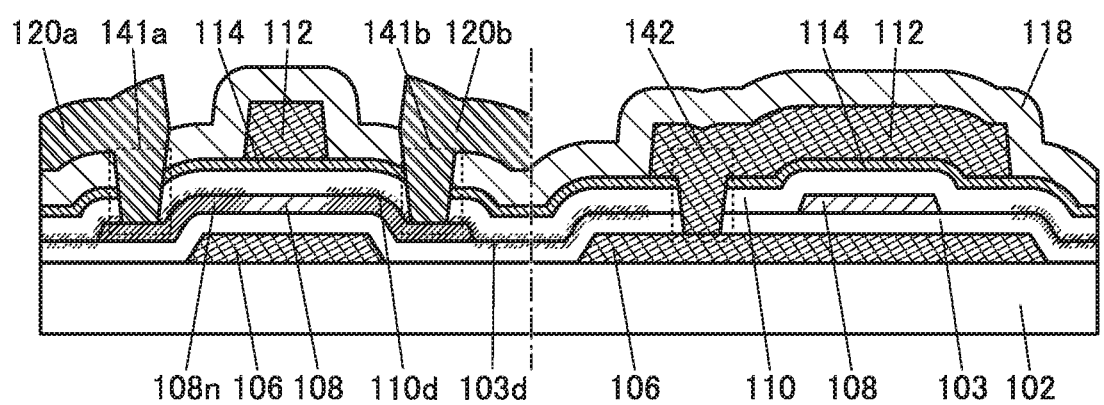
FIG. 21 is a cross-sectional view illustrating a transistor of a comparative sample according to Example 1.

As Comparative Sample B, a stacked-layer structure corresponding to the structure of the transistor illustrated in FIG. 21 was formed. In FIG. 21, a cross section of the transistor in the channel length direction and that in the channel width direction are shown side by side. Specifically, the conductive layer 106, the insulating layer 103, the semiconductor layer 108, the gate insulating layer 110, the metal oxide layer 114, the gate electrode 112, the insulating layer 118, the conductive layer 120a, and the conductive layer 120b were formed over the substrate 102. Furthermore, a planarization film (not shown) was formed over the insulating layer 118, the conductive layer 120a, and the conductive layer 120b.

In Sample A to which one embodiment of the present invention was applied, as described in Embodiment 1, the metal oxide layer 114 was formed over the gate insulating layer 110, heat treatment was performed, and then, the whole metal oxide layer 114 was removed. In contrast, in Comparative Sample B, the metal oxide layer 114 was not removed after the heat treatment was performed.

The manufacturing method of the transistors will be described in detail below with reference to FIGS. 5A to 5E, FIGS. 6A to 6C, FIGS. 7A to 7C, and FIGS. 8A and 8B.

First, an approximately 100-nm-thick tungsten film was formed over a glass substrate (which corresponds to the substrate 102) by a sputtering method and processed, whereby the conductive layer 106 was formed (FIG. 5A).

Then, the insulating layer 103 was formed over the substrate 102 and the conductive layer 106 (FIG. 5A and FIG. 6A). In this example, the insulating layer 103a, the insulating layer 103b over the insulating layer 103a, and the insulating layer 103c over the insulating layer 103b were formed as the insulating layer 103 as illustrated in FIG. 6A. An approximately 240-nm-thick silicon nitride film, an approximately 60-nm-thick silicon nitride film, and an approximately 5-nm-thick silicon oxynitride film were formed as the insulating layer 103a, the insulating layer 103b, and the insulating layer 103c, respectively, by a plasma CVD method.

Then, an approximately 40-nm-thick IGZO film was formed over the insulating layer 103 and processed, whereby the semiconductor layer 108 was formed (FIG. 5B). The IGZO film was formed by a sputtering method using a metal oxide target whose atomic ratio was In:Ga:Zn=1:1:1 with an oxygen flow rate ratio of 50% and at a substrate temperature of 100° C. After the IGZO film was formed, heat treatment was performed at 350° C. in a nitrogen atmosphere for one hour and subsequently, heat treatment was performed at 350° C. in a mixed atmosphere of oxygen and nitrogen for one hour.

Next, plasma treatment was performed for 20 seconds in an atmosphere containing a $N_2O$ gas and then, the gate insulating layer 110 was formed over the insulating layer 103 and the semiconductor layer 108 (FIG. 5C and FIG. 6C). In this example, the insulating layer 110a, the insulating layer 110b over the insulating layer 110a, and the insulating layer 110c over the insulating layer 110b were formed as the gate insulating layer 110 as illustrated in FIG. 6C. An approximately 5-nm-thick silicon oxynitride film, an approximately 140-nm-thick silicon oxynitride film, and an approximately 5-nm-thick silicon oxynitride film were formed as the insulating layer 110a, the insulating layer 110b, and the insulating layer 110c, respectively, by a plasma CVD method. The insulating layer 110a and the insulating layer 110c were each formed under conditions where the film formation speed was lower than that for the insulating layer 110b.

Next, an approximately 5-nm-thick aluminum oxide film was formed as the metal oxide layer 114 over the gate insulating layer 110 by a sputtering method in an oxygen-containing atmosphere (FIG. 5C). By forming the metal oxide layer 114 in an oxygen-containing atmosphere, oxygen can be supplied into the gate insulating layer 110. The substrate temperature during formation of the aluminum oxide film was 170° C. After the aluminum oxide film was formed, heat treatment was performed at 350° C. in a mixed atmosphere of oxygen and nitrogen for one hour.

Here, in Sample A, the whole metal oxide layer 114 was removed (FIG. 5D) before the next step was performed. In contrast, in Comparative Sample B, the metal oxide layer 114 was not removed before the next step was performed.

Next, over the gate insulating layer 110 in Sample A and over the metal oxide layer 114 in Comparative Sample B, an approximately 100-nm-thick molybdenum film was formed as the conductive film 112f by a sputtering method (FIG. 5E), and the approximately 100-nm-thick molybdenum film was processed; thus, the gate electrode 112 was formed (FIG. 7A).

Then, boron (B) was supplied with the use of a plasma ion doping apparatus (FIG. 7B and FIG. 7C). In this step, boron was supplied to the semiconductor layer 108 and the gate insulating layer 110 (as well as the metal oxide layer 114 in Comparative Sample B) with the use of the gate electrode 112 as a mask. A $B_2H_6$ gas was used as a gas for supplying boron, the acceleration voltage was 40 kV, and the dosage was $2\times10^{15}$ ions/cm$^2$.

Next, an approximately 300-nm-thick silicon oxynitride film was formed as the insulating layer 118 over the gate insulating layer 110 and the gate electrode 112 by a plasma CVD method (FIG. 8A).

Then, an opening was formed in part of the gate insulating layer 110 and the insulating layer 118. In Comparative Sample B, the opening was also formed in part of the metal oxide layer 114. Then, an approximately 100-nm-thick molybdenum film was formed by a sputtering method and processed, whereby the conductive layer 120a and the conductive layer 120b were formed (FIG. 8B).

After that, an approximately 1.5-μm-thick acrylic film was formed as a planarization film (not shown) and heat treatment was performed at 250° C. in a nitrogen atmosphere, for one hour.

Through the above steps, the samples were manufactured.

Figure 22A:
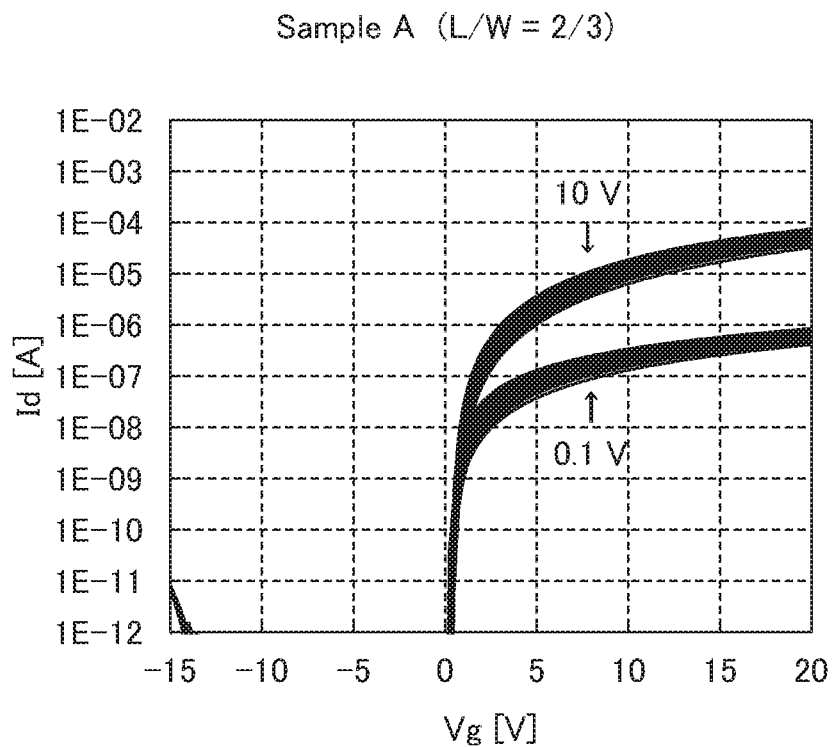
FIGS. 22A and 22B are graphs showing electrical characteristics of transistors according to Example 1.
Figure 22B:
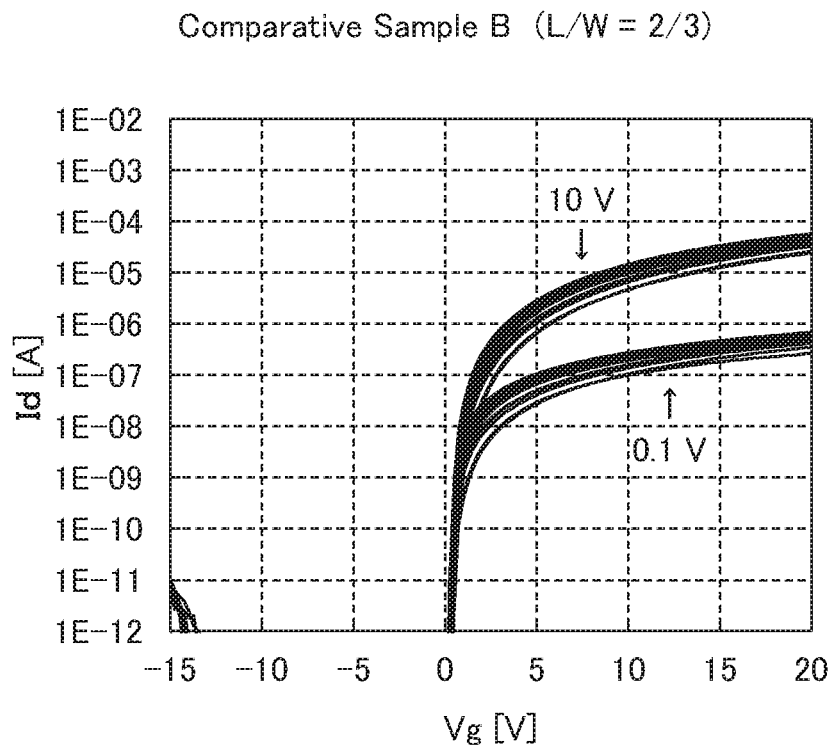
Figure 23A:
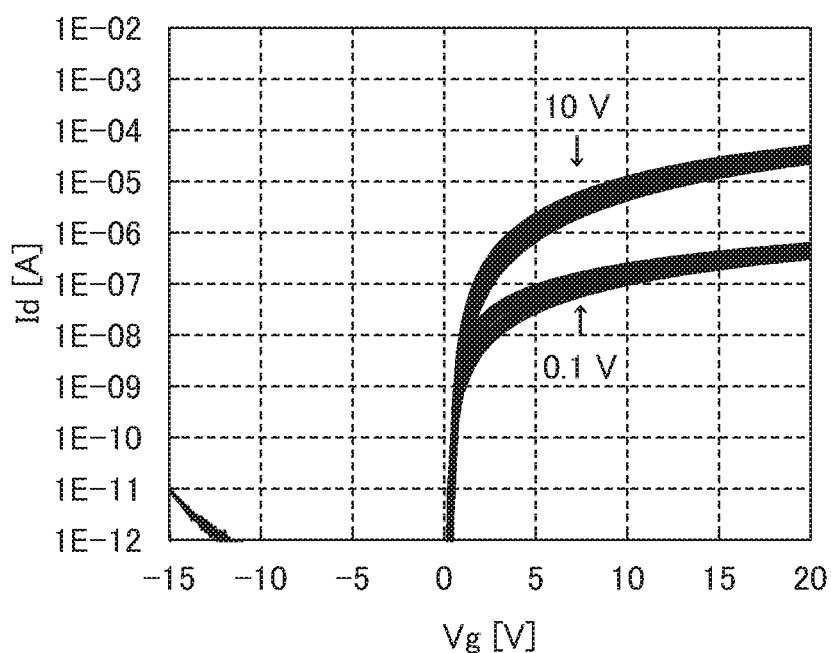
FIGS. 23A and 23B are graphs showing electrical characteristics of transistors according to Example 1.
Figure 23B:
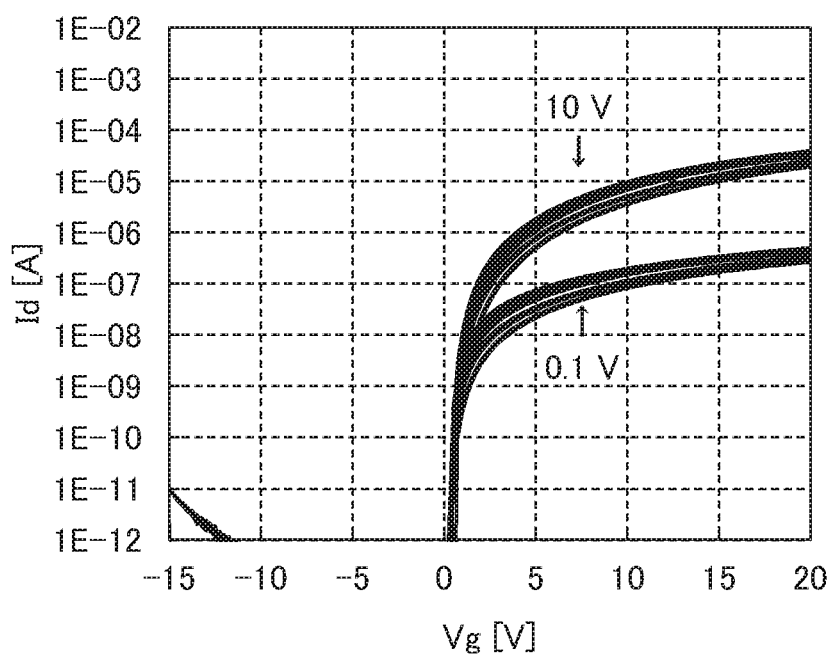

Next, the Id-Vg characteristics of the transistors of the samples were measured. FIG. 22A and FIG. 23A each show the results of the Id-Vg characteristics of the transistor in Sample A and FIG. 22B and FIG. 23B each show the results of the Id-Vg characteristics of the transistor in Comparative Sample B. FIG. 22A and FIG. 22B show the results of the transistors with a channel length (L) of 2 μm and a channel width (W) of 3 μm, and FIG. 23A and FIG. 23B show the results of the transistors with a channel length (L) of 3 μm and a channel width (W) of 3 μm.

As for conditions for measuring the Id-Vg characteristics of the transistors, voltages from −15 V to +20 V were applied in increments of 0.25 V to the gate electrode 112 (as gate voltage (Vg)) and to the conductive layer 106 (as back gate voltage (Vbg)). Voltage applied to the source electrode (source voltage (Vs)) was 0 V (comm), and voltage applied to the drain electrode (drain voltage (Vd)) was 0.1 V and 10 V.

In FIGS. 22A and 22B and FIGS. 23A and 23B, the vertical axis indicates drain current (Id (A)) and the horizontal axis indicates gate voltage (Vg (V)).

As shown in FIGS. 22A and 22B and FIGS. 23A and 23B, Sample A and Comparative Sample B were not significantly different in the Id-Vg characteristics and favorable characteristics were achieved in both samples.

Next, stress tests were performed on the transistors in the samples.

As the stress tests, gate bias-temperature (GBT) stress tests were employed. In this example, results of PBTS tests and NBTIS tests are shown. In the PBTS test, the substrate over which the transistor was formed was held at 60° C., a voltage of 0 V was applied to the source and the drain of the transistor, and a voltage of 45 V was applied to the gate; this state was held for 3600 seconds. In the NBTIS test, a voltage of 0 V was applied to the source and the drain of the transistor and a voltage of −45 V was applied to the gate in a state where the substrate over which the transistor was formed was held at 60° C. and light irradiation with white LED light at 10000 1x was performed; this state was held for 3600 seconds.

Figure 24:
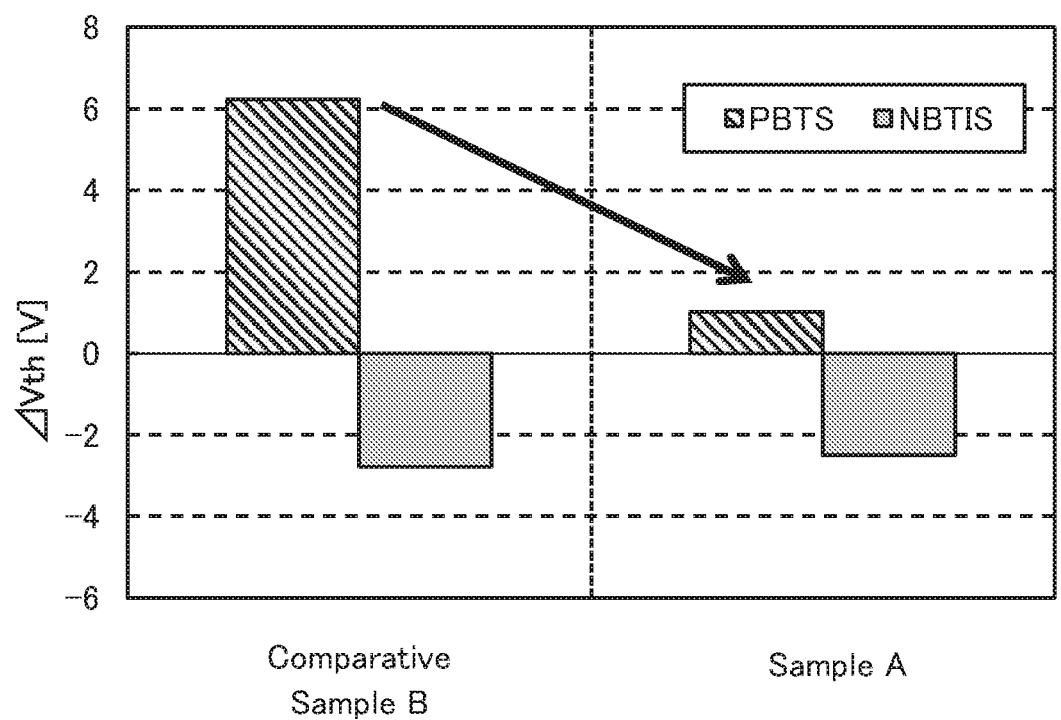
FIG. 24 is a graph showing results of reliability evaluation of transistors according to Example 1.

FIG. 24 shows the results of the PBTS tests and the NBTIS tests for Sample A and Comparative Sample B. FIG. 24 shows the results of the transistors with a channel length (L) of 2 μm and a channel width (W) of 3 μm.

As shown in FIG. 24, in Sample A, the amount of change in the threshold voltage (ΔVth) in the PBTS test was approximately one sixth of that in Comparative Sample B, which showed that Sample A had extremely high reliability.

As described above, removal of the whole metal oxide layer 114 after the heat treatment led to a considerable improvement of PBTS degradation.

From the above, it was found that removal of the whole metal oxide layer 114 after the heat treatment enabled manufacture of transistors both the electrical characteristics and reliability of which were excellent.

This application is based on Japanese Patent Application Serial No. 2018-149954 filed with Japan Patent Office on Aug. 9, 2018, the entire contents of which are hereby incorporated by reference.

What is claimed is:

1. A method for manufacturing a semiconductor device, comprising:
   forming a semiconductor layer comprising a metal oxide;
   forming a gate insulating layer comprising an oxide over the semiconductor layer;
   forming a metal oxide layer over the gate insulating layer;
   performing heat treatment after forming the metal oxide layer;
   removing the metal oxide layer after the heat treatment;
   forming a gate electrode overlapping with part of the semiconductor layer over the gate insulating layer after removing the metal oxide layer; and
   supplying a first element through the gate insulating layer to a region of the semiconductor layer not overlapping with the gate electrode,
   wherein the first element is phosphorus, boron, magnesium, aluminum, or silicon.

2. The method according to claim 1, wherein the metal oxide layer comprises an aluminum oxide film.

3. The method according to claim 1, wherein the metal oxide layer and the semiconductor layer comprise a same metal oxide.

4. The method according to claim 1, wherein the steps performed after the metal oxide layer is removed are each performed at a temperature lower than or equal to a temperature of the heat treatment.

5. The method according to claim 1, wherein:
   the gate insulating layer comprises a first layer over the semiconductor layer, a second layer over the first layer, and a third layer over the second layer;
   a film formation speed of the first layer is lower than a film formation speed of the second layer; and
   a film formation speed of the third layer is lower than the film formation speed of the second layer.

6. The method according to claim 1, wherein the semiconductor layer comprises at least one of indium and zinc.

7. The method according to claim 6, wherein:
   the semiconductor layer comprises indium, an element M, and zinc; and
   the element M is at least one of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium.

8. The method according to claim 7, wherein the element M is at least one of gallium, aluminum, yttrium, and tin.

9. The method according to claim 1, wherein the semiconductor layer comprises indium, gallium, and zinc.

10. The method according to claim 1, wherein oxygen is supplied to the semiconductor layer by the heat treatment.

11. A method for manufacturing a semiconductor device, comprising:
   forming a semiconductor layer comprising a metal oxide;
   forming a gate insulating layer comprising an oxide over the semiconductor layer;
   forming a metal oxide layer over the gate insulating layer;
   performing heat treatment after forming the metal oxide layer;

removing the metal oxide layer after the heat treatment and exposing the gate insulating layer;

forming a gate electrode overlapping with part of the semiconductor layer over the gate insulating layer after removing the metal oxide layer; and supplying a first element through the gate insulating layer to a region of the semiconductor layer not overlapping with the gate electrode, wherein the first element is phosphorus, boron, magnesium, aluminum, or silicon.

12. The method according to claim 11, wherein the metal oxide layer comprises an aluminum oxide film.

13. The method according to claim 11, wherein oxygen is supplied to the semiconductor layer by the heat treatment.

* * * * *